United States Patent [19]

Fujita et al.

[11] 4,244,043
[45] Jan. 6, 1981

[54] FREQUENCY DIVISION SYSTEM

[75] Inventors: Hiro Fujita, Sayama; Akira Tsuzuki, Tokorozawa; Heihachiro Ebiha, Tokorozawa; Fukuo Sekiya, Tokorozawa, all of Japan

[73] Assignee: Citizen Watch Co., Ltd., Tokyo, Japan

[21] Appl. No.: 25,048

[22] Filed: Mar. 29, 1979

[30] Foreign Application Priority Data

| Mar. 31, 1978 | [JP] | Japan | 53-37634 |
| Apr. 11, 1978 | [JP] | Japan | 53-42382 |
| Jul. 7, 1978 | [JP] | Japan | 53-82752 |
| Jul. 18, 1978 | [JP] | Japan | 53-87588 |
| Jul. 26, 1978 | [JP] | Japan | 53-91315 |

[51] Int. Cl.³ .................... G04G 3/02; H03L 7/00
[52] U.S. Cl. .................... 368/85; 331/25; 368/156
[58] Field of Search ............ 58/23 R, 23 AC; 331/25; 368/62, 85, 156

[56] References Cited

U.S. PATENT DOCUMENTS

| 3,982,194 | 9/1976 | Chi et al. | 331/25 |
| 4,017,806 | 4/1977 | Rogers | 331/25 |

*Primary Examiner*—Edith S. Jackmon
*Attorney, Agent, or Firm*—Holman & Stern

[57] ABSTRACT

A system for performing frequency division of a high frequency signal by intermittent operation of a frequency dividing counter circuit and by a phase lock loop circuit, in which phase lock is periodically achieved with an output of the counter circuit. Phase lock loop circuit is of novel design which provides exact phase lock without cyclic variations from the reference phase.

20 Claims, 26 Drawing Figures

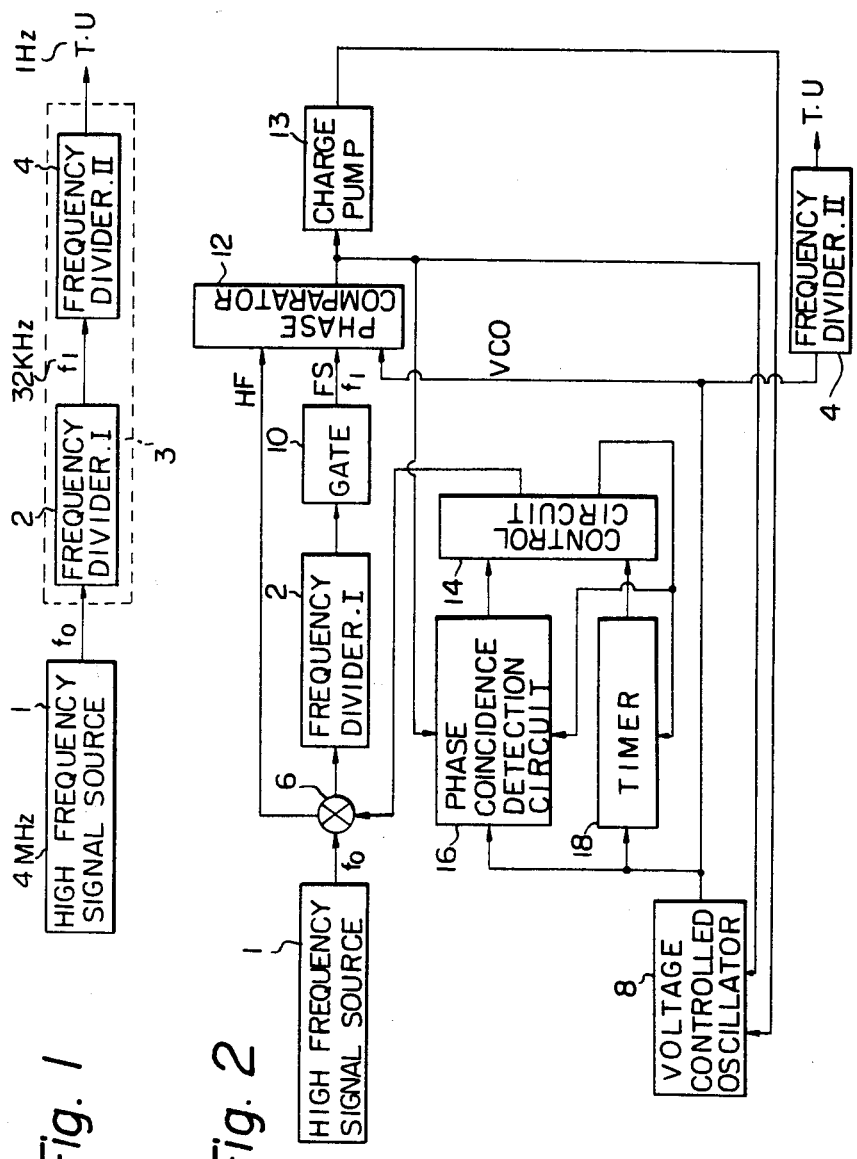

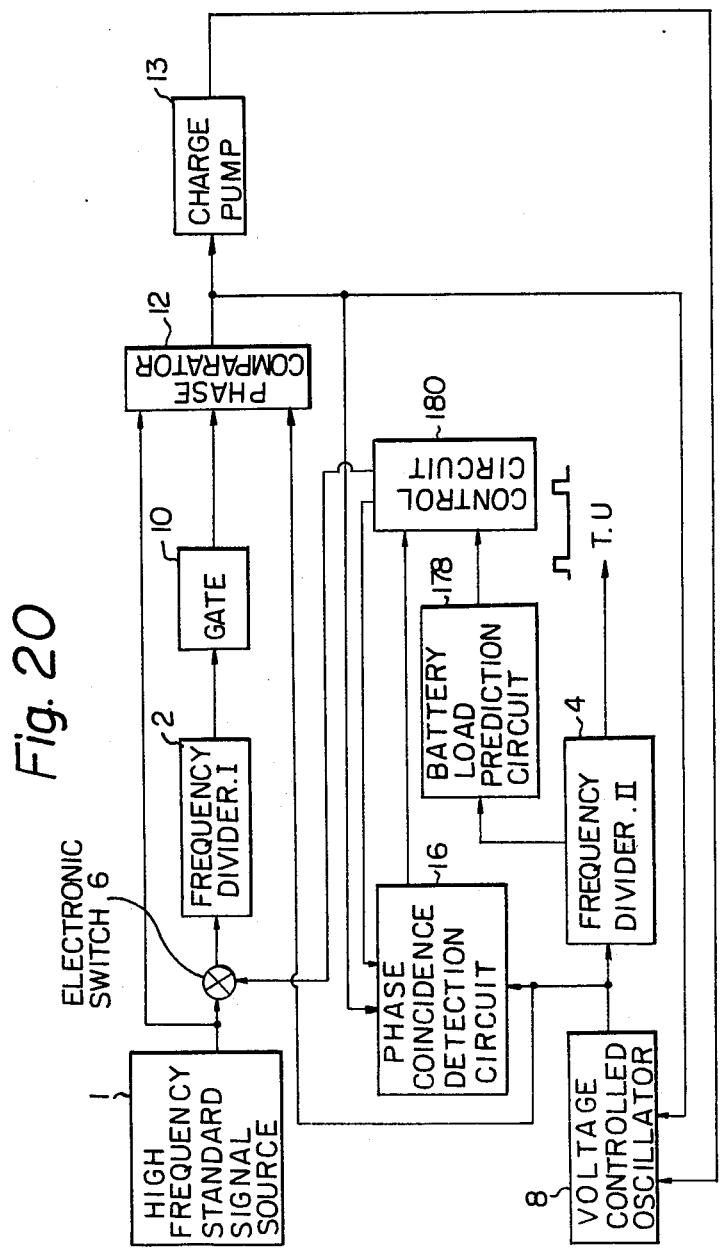

FREQUENCY DIVISION SYSTEM

BACKGROUND OF THE INVENTION

This invention relates to systems for performing frequency division of a high frequency signal with a very low level of power consumption, and in particular to a system for frequency division of a high frequency signal by employing intermittent operation of a phase lock loop, for use in a portable electronic timepiece.

At the present invention, there are various types of electronic devices of miniaturized portable type, such as electronic wristwatches and pocket calculators, for which the level of power consumption should be as low as possible, in order to ensure the maximum possible battery lifetime. Electronic wristwatches which are manufactured at present generally utilize complementary metal oxide silicon field effect transistor circuitry, which ensures a very low degree of power consumption. This is due to the fact that such devices have an extremely high impedance with respect to DC applied voltage when in the biased-off state. However, when such devices are used for switching, as in the case of the flip-flops in a frequency divider circuit for example, then as the frequency of operation is increased, the level of power consumption of the circuitry begins to increase sharply. For this reason, a major part of the power consumption of an electronic timepiece is due to the initial stages of frequency division of the high frequency output signal from the quartz crystal standard frequency oscillator circuit of the timepiece.

It is possible to operate these initial stages of frequency division in an intermittent manner, as will be described in the present disclosure, by producing a phase locked signal from a phase locked loop which is periodically locked into frequency and phase synchronism with the output of the initial frequency divider stages. After phase lock has been confirmed, the initial frequency divider stages are made inoperative, and the timekeeping circuits of the timepiece are supplied with the output signal from the variable frequency oscillator of the phase locked loop, either directly or through a frequency divider. After a predetermined period of time has elapsed, during which a slight degree of phase shift may have occurred in the signal from the variable frequency oscillator, the variable frequency oscillator is again locked into synchronism with the output signal from the initial stages of frequency division, which are again made operable at that time. However, it is difficult to implement such a system and to ensure reliable and precise operation, if a phase locked loop of conventional type is utilized. This is due to the fact that such a device does not actually provide continuous and exact phase lock with respect to the phase of a reference frequency. Instead, the phase of the signal from the variable frequency oscillator of a conventional phase lock loop cyclically varies with respect to the reference frequency phase. Over the long term, this variation in phase is generally unimportant for many applications. However, for the type of application toward which the present invention is directed, such as the frequency divider system of an electronic timepiece, it is essential to utilize a phase lock loop which provides exact phase lock.

Another disadvantage of a conventional type of phase lock loop is that it is often necessary to adjust the circuit so as to ensure that phase lock occurs at the desired reference frequency, and not at some harmonic or submultiple of the reference frequency. Providing automatic means for ensuring that phase lock occurs only at the reference frequency, for example when power is first switched on to the circuit, would be difficult and complex to implement with a conventional type of phase lock loop.

With a frequency divider system in accordance with the present invention, the above disadvantages of a conventional type of phase lock loop are eliminated. Precise locking into synchronism in phase and frequency with a reference frequency signal is ensured, without periodic variations in phase of the signal provided by the phase lock loop. In addition, recovery of phase lock in the event of temperary loss of lock due to a transient disturbance is accomplished rapidly and along an exponential curve with respect to time. Furthermore, means can be provided whereby an initial condition can be established after, for example, applying power to the circuit, whereby the signal provided by the phase lock loop becomes locked into synchronism in frequency and phase with the reference frequency in an automatic and reliable manner.

SUMMARY OF THE INVENTION

With a frequency divider system in accordance with the present invention, a relatively low frequency signal which is an integral submultiple of a high frequency signal is alternately produced by a frequency divider which operates upon the high frequency signal and whose output is used as a reference frequency signal for a phase lock loop, and by the output signal of the phase lock loop after phase lock has been achieved and the frequency divider has been deactivated. While the frequency divider is deactivated, and the relatively low frequency output signal is being provided from the output of the phase lock loop, the phase of the signal provided by the phase lock loop variable frequency oscillator and the phase of the high frequency signal are compared. Any deviation in phase of the signal from the variable frequency oscillator is detected, and is used to modify the period of the phase lock loop signal. An extremely high degree of accuracy and reliability is thus achieved for the frequency divider system, while, due to the intermittent manner in which the frequency divider coupled to receive the high frequency signal is operated, the power consumption of the frequency division system is significantly reduced with respect to conventional systems.

It is therefore an object of the present invention to provide an improved system for frequency division of a relatively high frequency signal.

More particularly, it is an object of the present invention to provide an improved system for frequency division of a relatively high frequency signal whereby a relatively low frequency signal is alternately provided by a frequency divider and by a phase lock loop, and whereby the power consumption of the frequency division system is reduced by operating said frequency divider in an intermittent manner.

Further objects, features and advantages of the present invention will be made more apparent from the following description, when taken in conjunction with the attached drawings, whose scope is given by the attached claims.

BRIEF DESCRIPTION OF THE DRAWINGS

FIG. 1 is a block diagram illustrating the general configuration of a frequency division system such as is used in a conventional electronic timepiece;

FIG. 2 is a general block diagram of a frequency division system for an electronic timepiece in accordance with the present invention;

FIG. 20 is a block diagram of a frequency division system for performing initiation of the pre-scaling operating made when a high battery load is applied.

DESCRIPTION OF THE PREFERRED EMBODIMENT

Figure 3:
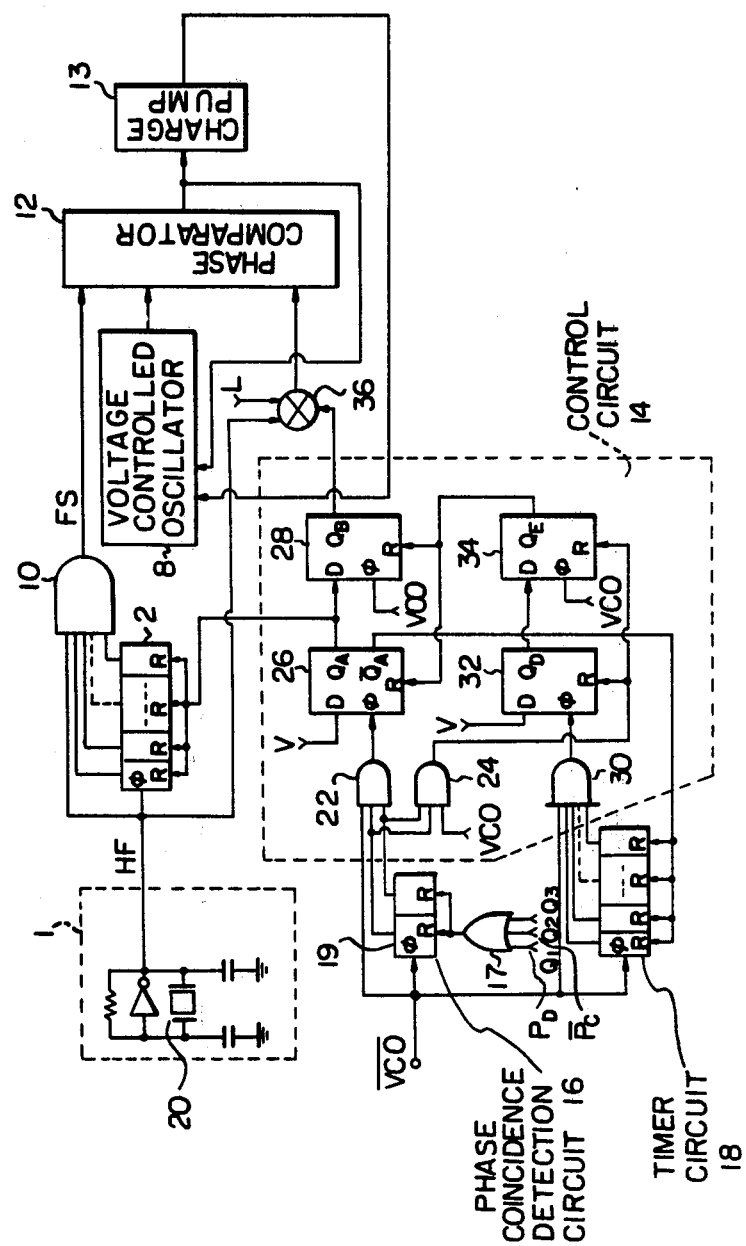
FIG. 3 is a general circuit diagram illustrating portions of the system of FIG. 2 in greater detail.

Referring now to the figures, FIG. 1 is a general block diagram of the frequency division system of a conventional type of electronic timepiece. Numeral 1 denotes a source of a standard high frequency signal whose frequency we can designate as $f_0$. The signal with frequency $f_0$ is applied to a frequency divider circuit 2, in which the frequency is divided by a certain factor $n_1$, to provide an output signal having a frequency which we can designate as $f_1$, where $f_0/f_1$ is an integer. The signal with frequency $f_1$ is applied to a second frequency divider circuit 4, in which the frequency is divided by a factor $n_2$, to provide a time unit signal, which generally has a frequency of 1 Hz. The designs of frequency divider circuits 2 and 4 may be different, due to the fact that circuit 2 must handle an input signal of much higher frequency than that applied to counter circuit 4. In most of such circuits which are being manufactured at present, complementary metal oxide silicon field effect transistor circuit elements are utilized. Such circuit elements have the characteristic of consuming an extremely low level of power when operated at low frequencies, but of displaying a rapid increase in power consumption as the operating frequency is increased beyond a certain value. For this reason, frequency divider 2 of an electronic timepiece consumes a substantial amount of power, by comparison with other parts of the timepiece circuitry. In order to increase the battery lifetime of an electronic timepiece, it is desirable to reduce the power consumed by frequency division of the high frequency standard signal $f_0$ as far as possible.

Referring now to FIG. 2, a general block diagram of a frequency division system for an electronic timepiece in accordance with the present invention is shown. In the following description, we shall designate the signal produced by standard frequency signal source 1 as HF. This signal is applied to an electronic switch 6, which cause signal HF to be applied either to an input of a first frequency divider circuit 2 or to an input of a phase comparator circuit 12. A gate circuit 10 is coupled to provide a signal, designated hereinafter as the FS signal, which has an identical frequency to the output from the final stage of frequency divider 2, but is substantially synchronized with signal HF. Signal FS is also applied to an input of phase comparator circuit 12. Phase comparator 12 also receives the output signal from a voltage controlled oscillator 8, and compares the phase of this signal (which shall be designated as signal VCO) with the phase of either signal FS or HF, depending upon which is selected by the action of electronic switch 6. Depending upon whether the phase of signal VCO is leading or lagging signal FS (or HF), phase comparator circuit 12 supplies phase control pulses to a charge pump circuit 13, causing the voltage across a capacitor to be either increased or decreased, depending upon whether the phase control pulses cause the capacitor to be charged or discharged. The capacitor voltage, designated hereinafter as Vc, is applied as a frequency control voltage to voltage controlled oscillator 8, to control the frequency of signal VCO. Each of phase control pulses from phase comparator 12 is also applied directly to voltage controlled oscillator 8, in order to perform direct control of the phase of signal VCO, as shall be described later.

Numeral 14 denotes a control circuit, which provides an output signal to control electronic switch 6, thereby determining the duration of the intermittent operations of frequency dividing counter 2. Control circuit 14 also provides a control signal which controls a time circuit 18, an output of which is applied to control circuit 14. Numeral 16 denotes a phase coincidence detection circuit, which receives signal VCO and also a control signal from control circuit 14 and from phase comparator 12. While control circuit 14 is providing an output which causes electronic switch 6 to apply signal HF to frequency dividing counter 2, phase comparator 12, charge pump 13 and voltage controlled oscillator 8 function as a phase lock loop, causing signals FS and VCO to become locked to the same frequency and phase. When phase lock is achieved, this is detected by phase coincidence detection circuit 16, which applies a signal to control circuit 14 causing a control switch to be applied to electronic switch 6 that inhibits the operation of frequency divider 2 and causes signal HF to be applied to phase comparator 12, for comparison with signal VCO. Thereafter, for a time duration which is determined by timer circuit 18, the VCO signal is maintained in phase synchronism with signal HF, although the frequencies of these signals are considerably different. At the end of this time duration, a control signal from control circuit 14 again causes electronic switch 6 to begin the operation of frequency divider 2, to bring signals VCO and FS into a phase locked relationship. In this way, frequency dividing counter circuit 2 can be operated intermittently. This system provides a high degree of reliability due to the fact that, while frequency divider 2 is inoperative, so that the signal supplied to low frequency counter circuit 4 is supplied by voltage controlled oscillator 8, any tendency for signal VCO to vary in phase is suppressed by the action of the phase lock loop, through comparison with the phase of signal HF. In addition, there is a large allowable margin of variation in the phase of signal VCO during the periods when counter 2 is inoperative, due to the fact that exact synchronism in both phase and frequency is established between signals FS and VCO during the periods when counter 2 is operative. Such exact synchronism in phase cannot be attained by a conventional type of phase lock loop.

In such a frequency division system, signal HF can be of the order of 4 MHz, and signal VCO can be in the region of 32 KHz.

The frequency division system of FIG. 2 will now be described in greater detail, with reference to the circuit diagram of FIG. 3. In FIG. 3, numeral 1 denotes a source of a standard frequency signal HF having frequency $f_0$, which comprises a crystal oscillator controlled by an AT-cut quartz crystal 20. Frequency divider 2 has reset terminals controlled by an output of control circuit 14, which performs part of the functions of the electronic switch 6 in FIG. 2, i.e. making counter circuit 2 operative or inoperative. The other functions of switch 6 in FIG. 2, i.e. connection and disconnection of signal HF to phase comparator 12, are performed by electronic switch 36. AND gate 10 generates the logical product of all of the outputs from the stages of divider circuit 2 and signal HF. This is done in order to provide a signal which has the same frequency as that of the output from the final stage of circuit 2 but which is substantially free from the delay caused by propogation through the various stages of divider 2. This signal, FS, has frequency $f_1 = f_0/n$, where n is the division factor of counter circuit 2. Since the output from AND gate 10 has the same pulse width as signal HF, its duty cycle is extremely low. However this can easily be dealt with by providing a latch circuit at the output of AND gate 10. For the sake of simplicity of description, such a circuit is not shown in FIG. 3. Hereinafter, the mode of operation of the circuit of FIG. 3 in which signal FS is compared with signal VCO, and brought into phase lock by the operation of the phase lock loop, will be designated as PS operation, as an abbreviation for pre-scaling operation. The mode of operation in which frequency dividing counter 2 is inoperative and signal FS does not control the VCO signal will be designated as PL operation, as an abbreviation for phase lock operation. By taking signal FS from the output of AND gate 10, rather than from the final stage of divider 2, timing errors which would otherwise occur when a transition occurs from PL operation to PS operation are eliminated.

Control circuit 14 comprises three AND gates, 22, 24 and 30, and four data-type flip-flops 26, 28, 32 and 34. Phase coincidence detection circuit 16 comprises a counter 19 having reset terminals coupled to the output of a OR gate 17. Two inputs to OR gate 17 Pd and $\overline{Pc}$, are provided from phase comparison circuit 12, and consist of pulses which indicate that signal VCO is either leading or lagging the phase of signal FS. The other input to OR gate 17 is from the $Q_B$ output of flip-flop 28. Timer 18 consists of a counter having reset terminals coupled to output $\overline{Q}_A$ of flip-flop 26, and outputs coupled to inputs of AND gate 30.

Figure 4:
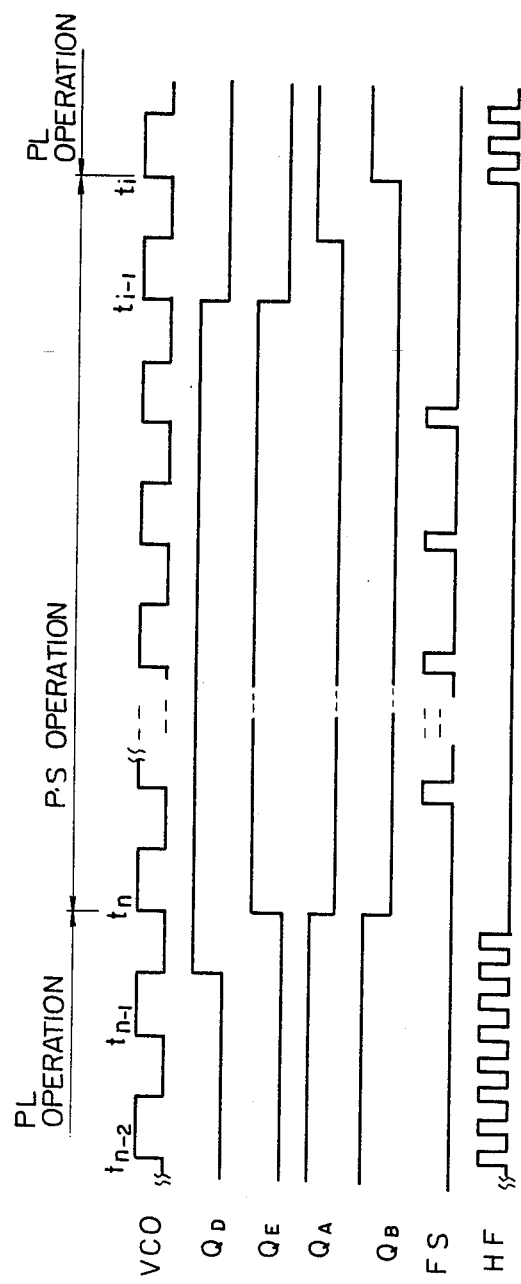
FIG. 4 is a waveform diagram illustrating the operation of the circuit of FIG. 3.

The operation of the circuit of FIG. 3 will be described with reference to the waveform diagram of FIG. 4. First, when the circuit is in the PL operation state, the outputs Qa and Qb of flip-flops 26 and 28 are at the high logic level potential (referred to hereinafter as the H level), causing frequency divider 2 to be in the reset state, so that the output from AND gate 10 is held at the low logic level potential (referred to hereinafter as the L level). The H level output of flip-flop (referred to hereinafter as FF) 28 causes electronic switch 36 to connect the HF signal to an input of phase comparator circuit 12. At this time, since the $\overline{Q}a$ output of FF 26 is at the L level, timer counter 18 is operative and is counting the $\overline{VCO}$ signal pulses applied to its clock terminal. When the outputs of all stages of timing counter 18 go to the H level and signal $\overline{VCO}$ is also at the H level, the output of AND gate 30 goes to the H level. We can designate the pulse of signal VCO which causes the output of AND gate 30 to go to the H level as the $(n-1)$ the pulse, counting from the time at which the reset condition of timing counter 18 was released. The output of AND gate 30 goes to the H level on the trailing edge of this $(n-1)$ pulse of signal VCO. The L level to H level transition at the output of AND gate 30 causes output Qd of FF 32 to go from the L level to the H level. As a result, since signal VCO is applied to the clock terminal of FF 34, the output Qe of FF 34 goes to the H level on the leading edge of the pulse of signal VCO, i.e. at time $t_n$.

When output Qe goes to the H level, FF 26 and FF 28 are reset, so that outputs Qa and Qb go to the L level. Prior to time $t_n$, output Qb, applied through OR gate 17, was holding counter circuit 16 in the reset condition. When Qb goes to the L level at time $t_n$, this reset state is released, and counter 19 begins to count the pulses of the $\overline{VCO}$ signal, unless input Pd or Pc is generated, indicating that phase lock is not achieved. Also at time $t_n$, the reset state of frequency divider 2 is released, so that signal FS begins to be output from AND gate 10 and applied to the phase comparison circuit 12. In addition, since output $\overline{Q}a$ of FF 26 is at the H level, the timer counter 18 is placed in the reset state. The circuit is now in the PS condition, in which signals FS and VCO are compared and are brought into phase and frequency lock.

In the PS operation mode, pulses Pd or Pc are produced periodically, until phase lock is established between signals VCO and FS. However, in order to make certain that phase lock has actually been achieved, the circuit configuration is arranged such that four successive VCO pulses must occur for which no Pd or $\overline{Pc}$ pulse is generated, in order for the transition to the PL operation mode to take place. This is accomplished by means of counter 16. In the embodiment shown in FIG. 3, counter 19 is a divide-by-four counter, however it is equally possible to increase or decrease the division factor of this counter. When both stages of counter 19 and signal VCO go to the H level, at a time which we shall designate as $t_{i-1}$, then the output of AND gate 24 goes to the H level. FF 32 and FF 34 are thereby reset, so that outputs Qd and Qe go to the L level. A short time later, the output of AND gate 22 goes to the H level on the trailing edge of signal VCO, causing output Qa of FF 26 to go to the H level, thereby resetting frequency divider 2 and holding it in the reset state. On the leading edge of the next VCO pulse, at time $t_i$ shown in FIG. 4, output Qb of FF 28 goes to the H level, in response to the H level state of Qa. This causes signal HF to be applied by electronic switch 36 to an input of phase comparison circuit 12. Since output $\overline{Qa}$ of FF 26 is now at the L level, the reset condition of timing counter 18 is released, and this counter begins to count the $\overline{VCO}$ pulses. The circuit is now once more in the PL mode of operation. During PS operation, electronic switch 36 applies an L level input to phase comparator circuit 12, to reduce the power consumption of this circuit.

During the PS mode of operation, the phase of the FS signal and that of the VCO signal are compared, and the phase of the VCO signal is adjusted to compensate for any slight variations. However, any major drift of the VCO frequency, due to an external disturbance or to a high level of leakage current in the capacitor of the VCO circuit, cannot be compensated for by phase comparison with the FS signal. This places an upper limit upon the time for which the circuit can be allowed to operate in the PL mode. This time can be adjusted by varying the number of stages of timer counter 18. Since the rate at which drift of the VCO frequency occurs is much more pronounced at higher temperatures than at normal operating temperatures, it is possible to arrange that the division ratio of timing counter 18 is reduced at high operating temperatures, or to eliminate the PL mode of operation when the temperature exceeds a predetermined level.

Figure 5:
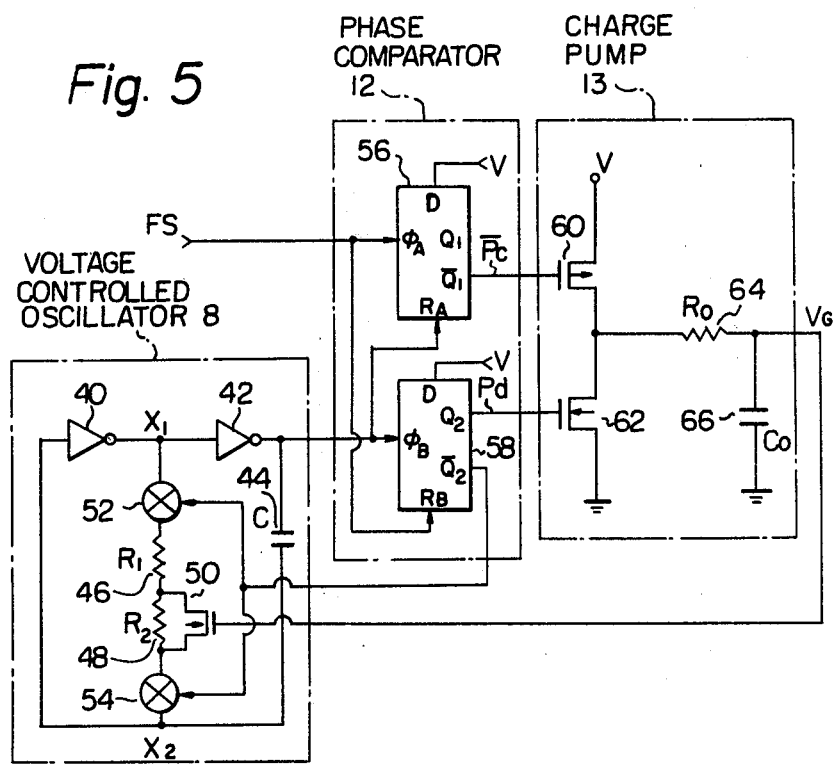
FIG. 5 is a general circuit diagram of a voltage controlled oscillator and a charge pump shown in FIG. 2.

The operation of an embodiment of a phase lock loop circuit in accordance with the present invention will now be described, with reference to the circuit diagram of FIG. 5 and the waveform diagram of FIG. 6. In FIG. 5, numeral 8 denotes a voltage controlled oscillator, and numeral 12 a phase comparator circuit which compares the phase of the output signal from voltage controlled oscillator circuit 8 with that of signal FS. Phase control pulses $\overline{Pc}$ and Pd are produced by phase comparator circuit 12, indicating that the phase of signal VCO is leading or lagging that of signal FS, and are applied to a charge pump circuit 13 to control the charge of a capacitor 66. The voltage across capacitor 66, designated as Vg, is applied to voltage controlled oscillator 8 to control the frequency of signal VCO. Each of control pulses from phase comparator circuit 12 is also used to directly control the phase of signal VCO, as will be explained in the following.

Voltage controlled oscillator 8 is a ring oscillator circuit, containing a pair of inverters 40 and 42 connected in series, and with a capacitor 44 coupled between the output of inverter 42 and the input of inverter 40. Resistors 46 and 48 are connected in series with two electronic switches 52 and 54, between the output of inverter 40 and the junction between the input of inverter 40 and the capacitor 44. A field effect transistor (referred to hereinafter as FET) 50 has its source and drain terminals connected across resistor 48. The gate terminal of FET 50 is connected to capacitor 66 of charge pump circuit 13, to receive control voltage Vg and FET 50 serves as a source of a fixed voltage. FET 50 is of N-channel type, so that as voltage Vg increases above the threshould voltage of FET 50, the resistance presented between the source and drain of FET 50 decreases towards a very low value, while as voltage Vg is decreased below the threshold voltage of the FET, the resistance between source and drain increases towards a very high value. When electronic switches 52 and 54 are in the closed condition, then the frequency of signal VCO is determined by the time constant of capacitor 44 and of resistor 46 in series with the parallel combination of resistor 48 and FET 50. It is therefore possible to control the frequency of signal VCO by means of voltage Vg. When electronic switches 52 and 54 are placed in the open condition for a short period of time, the path between the output of inverter 40 and capacitor 44 is opened. This has the effect of causing a delay in the phase of signal VCO, with the amount of phase delay being proportional to the duration of the time for which the electronic switches 52 and 54 are in the open state.

Phase comparator 12 comprises two data-type flip-flops 56 and 58, with signal VCO being applied to the clock terminal of FF 58 and to the reset terminal of FF 56. Signal FS is applied to the clock terminal of FF 56 and to the reset terminal of FF 58. Output Q1 of FF 56 is applied to the gate of a P-channel FET 60 in charge pump circuit 13, while output Q2 of FF 58 is applied to the gate of an N-channel FET 62 in circuit 13. The drain terminals of transistors 60 and 62 are connected together and through a resistor 64 to capacitor 66. When the voltage applied to the gate of transistor 60 goes to the L level, then voltage V is applied to resistor 64, causing a charging current to flow into capacitor 66. When the voltage applied to the gate of transistor 62 goes to the H level, capacitor 64 begins to discharge through reisistor 64 and FET 62.

Figure 6:
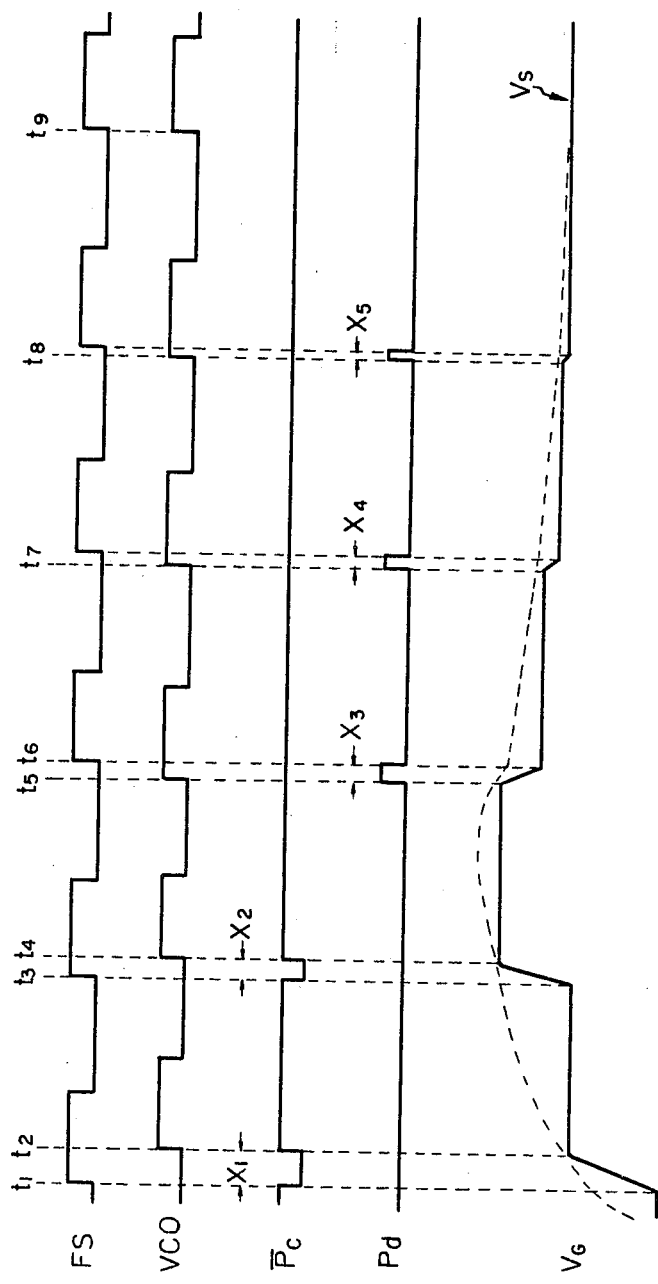
FIG. 6 is a waveform diagram illustrating the operation of the circuit of FIG. 5.

Referring now to the waveform diagram of FIG. 6, it is assumed that at time t1, signal VCO is lagging in phase with respect to signal FS, with the amount of phase lag being $(t_1-t_2)=X_1$. When signal FS goes to the H level at time $t_1$, FF 58 is reset, so that output $\overline{Q2}$ goes to the H level while Q2 goes to the L level. The $\overline{Q1}$ output of FF 56 also goes to the L level at time $t_1$, due to the H level input applied to the data terminal of FF 56. When signal VCO goes to the H level, at time $t_2$, FF 56 is reset so that output $\overline{Q1}$ goes to the H level, while outputs $\overline{Q2}$ and Q2 of FF 58 remain at the H and L levels respectively. Output $\overline{Q1}$ thus remains at the L level for time $X_1$, as shown in FIG. 6, and during this time a charging current is supplied through resistor 64 to capacitor 66, causing voltage Vg to rise. The signal produced from the $\overline{Q1}$ output of FF 56 is denoted by $\overline{Pc}$ in the waveform diagram of FIG. 6. Subsequently, at time $t_3$, since signal VCO is still lagging with respect to signal FS, the process described above is repeated. Signal $\overline{Pc}$ thus goes to the L level for a time duration of $X_2=(t_4-t_3)$. During time $X_2$, voltage $V_{dd}$ is applied to resistor 64, through FET 60, causing a charging current to flow into capacitor 66, so that voltage Vg on capacitor 66 again rises. Each time voltage Vg is caused to increase, as described above, a decrease in the resistance between source and drain of transistor 50 occurs, causing a proportionate increase in the frequency of signal VCO. As a result, the phase of signal VCO begins to lead that of signal FS.

At time $t_5$, the phase of signal VCO leads the phase of signal FS by an amount $(t_6-t_5)$. When signal VCO goes to the H level at time $t_5$, a reset input is applied to FF 56 so that output $\overline{Q1}$ is held at the H level. The L level to H level transition of signal VCO at time $t_5$ also causes output Q2 of FF 58 to go to the H level and output $\overline{Q2}$ to go to the L level. The signal produced at terminal Q2 of FF 58 is denoted by Pd in FIG. 6. When signal FS goes to the H level at time $t_6$, FF 58 is reset, causing signal Pd to return to the L level and signal $\overline{Pd}$ to return to the H level. While signal PD is at the H level, i.e. for time $X_3$, FET 62 presents a low resistance between its source and drain terminals, so that a discharge current flows from capacitor 66 through resistor 64 to ground. The voltage Vg across capacitor 66 is thereby decreased by a certain amount. As a result, the resistance between source and drain of FET 50 is increased, causing a lowering of the frequency of signal VCO. It is a particular feature of the present invention, however, that the phase of signal VCO is also modified during time $X_3$. While signal $\overline{Pd}$ is at the H level, electronic switches 52 and 54 are in the closed state, so that voltage controlled oscillator 8 oscillates normally. When signal $\overline{Pd}$ goes to the L level, however, each of electronic switches 52 and 54 goes into the open state, so that any change in the voltage across capacitor 44 due to charging or discharging through resistance 46 and the combination of resistor 48 and FET 50 is prevented. As a result, the phase of signal VCO is delayed by an amount which is determined by the duration of time $X_3$, i.e. by the pulse width of signal Pd. Thus, with a phase lock loop in accordance with the present invention, adjustment of the frequency of the voltage controlled oscillator signal is accomplished simultaneously with adjustment of the phase of the voltage controlled oscillator signal, to compensate for an error in phase with respect to a reference signal. At time $t_7$, therefore, the phase of signal VCO is closer to that of signal FS. The process described above is then repeated so that a pulse Pd with pulse width $X_4$ is generated and causes a discharge current to flow from capacitor 66 through resistor 64 and FET 62. The voltage Vg is thereby reduced by a small amount. At the same time, pulse $\overline{Pd}$ is applied to control the electronic switches 52 and 54, causing the phase of signal VCO to be again delayed by a small amount. At time $t_8$, the phase difference between signals VCO and FS has been reduced still further, and the process of phase delay and lowering of the frequency of signal VCO is repeated once more.

At time $t_9$, signals VCO and FS have been brought into phase and frequency coincidence, so that neither signal Pc nor Pd is generated, and so no change in the phase or frequency of signal VCO is conducted. Thereafter, signals VCO and FS will remain locked in phase, without cyclic variations.

In the case of a conventional type of phase lock loop, taking the condition at time $t_5$ as an example, only a decrease in the voltage Vg would be produced in order to compensate for the phase lead of signal VCO with respect to FS. The frequency of signal VCO would therefore be lowered after time $t_6$. Subsequently, at some time such as $t_9$, the phase comparator circuit would detect that signals FS and VCO were in phase coincidence, and would not generate a signal to cause phase correction. However, in practice, the amount of frequency change of signal VCO which had occurred up to time $t_9$ would be such that the phase of signal VCO would continue to change with respect to signal FS after $t_9$, and would therefore begin to lag with respect to signal FS. This would then be detected by the phase comparator circuit, and a correction signal generated to cause the frequency of signal VCO to be increased. Signals FS and VCO would therefore again come into phase coincidence at some subsequent point in time, after which signal VCO would begin to lead signal FS in phase. In other words, a condition of cyclic variation of the phase of signal VCO would occur, in which signals VCO and FS would be in precise phase coincidence only at periodic intervals. This is a consequence of the fact that, in a conventional phase lock loop, direct correction of the phase of the voltage controlled oscillator is not performed, but only adjustment of its frequency, to compensate for phase errors in the VCO signal. With a phase lock loop in accordance with the present invention, as shown in FIG. 6, it is possible to bring signals FS and VCO into precise phase coincidence, by a process in which the phase of signal VCO is brought into coincidence with that of the reference signal in an exponential manner with respect to time. This is a consequence of the fact that, for example at time $t_5$, when signal VCO is detected as leading signal FS in phase, a correction pulse Pd is generated which causes a change in the frequency of signal VCO, while at the same time signal $\overline{Pd}$ is applied to the voltage controlled oscillator circuit 8 in such a way as to cause a change in the phase of signal VCO directly. By a succession of increasingly smaller corrections steps, such as occur at times $t_5$, $t_7$ and $t_8$ in FIG. 6, signal VCO is brought into precise phase coincidence with signal FS at time $t_9$, without subsequent overshoot or fluctuations of the phase of signal VCO.

With the embodiment of a phase lock loop in accordance with the present invention shown in FIG. 5, the circuit arrangement is such that if the phase of signal VCO is initially lagging with respect to signal FS, then only control of the frequency of signal VCO is performed until signal VCO begins to lead signal FS in phase. Thereafter, correction of both phase and frequency of signal VCO are performed, so that signals FS and VCO are brought into phase coincidence. However, it is equally possible to arrange the circuit configuration such that if signal VCO is initially leading signal FS in phase, control of the frequency of signal VCO alone is performed until signal VCO begins to lag signal FS in phase. Thereafter, simultaneous control of phase and frequency of signal VCO can be performed, so as to bring signal VCO into phase coincidence with signal FS. Whichever method is adopted, the voltage Vg applied to control the frequency of signal VCO will reach a steady value at which signals VCO and FS are in a phase locked relationship, as indicated by voltage Vs in FIG. 6.

The operation of a phase lock loop in accordance with the present invention can be described by mathematical equations, as follows. Let $T_1$ be the period of signal VCO prior to time $t_5$ in FIG. 6, and let $T_2$ be the period of signal VCO after phase control has been applied, i.e. after time $t_6$. This gives the equations:

$$\Delta T_2 = \Delta T_1 - kx_3 \qquad \text{Eqn. 1}$$

$$x_4 = \Delta T_1 - P(x_3) + x_3 - kx_3 \qquad \text{Eqn. 2}$$

where $x_3$ is the amount of phase difference between signals VCO and FS detected at time $t_5$, and $x_4$ denotes the amount of phase difference detected subsequently at time $t_7$, while $\Delta T_1$ represents the difference in period between signals VCO and FS before time $t_5$ and $\Delta T_2$ represents the difference in period after control has been applied. For the ideal case in which $P(x_3) = x_3$, we can generalize equations 1 and 2 above in the form of a matrix, inserting the initial conditions. This gives:

$$\begin{pmatrix} \Delta T_n \\ x_n \end{pmatrix} = \begin{pmatrix} 1, & -k \\ 1, & -k \end{pmatrix}^n \begin{pmatrix} \Delta T_0 \\ x_0 \end{pmatrix} \qquad \text{Eqn. 3}$$

where $\Delta T_n$ and $x_n$ are the period and phase differences at some later time $t_n$.

The eigenvalues of the coefficients of Equation 3 are obtained as:

$$\lambda_1 = 0, \lambda_2 = 1 - k \qquad \text{Eqn. 4}$$

The amount of phase difference between signals FS and VCO can thus be expressed in the general form:

$$x_n = A_0(1-k)^n \qquad \text{Eqn. 5}$$

where $A_0$ is a constant determined by the initial conditions. If the inequality $0 < k < 2$ is satisfied, then this indicates that the phase difference between signals VCO and FS can be reduced to zero in an exponential manner, without oscillation or overshoot of phase control occurring.

If a mathematical analysis similar to the above is performed for a conventional type of phase lock loop, in which direct control of phase is not performed, the resulting equation for the value of $x_n$ indicates a divergent condition or an oscillatory condition.

Figure 7:
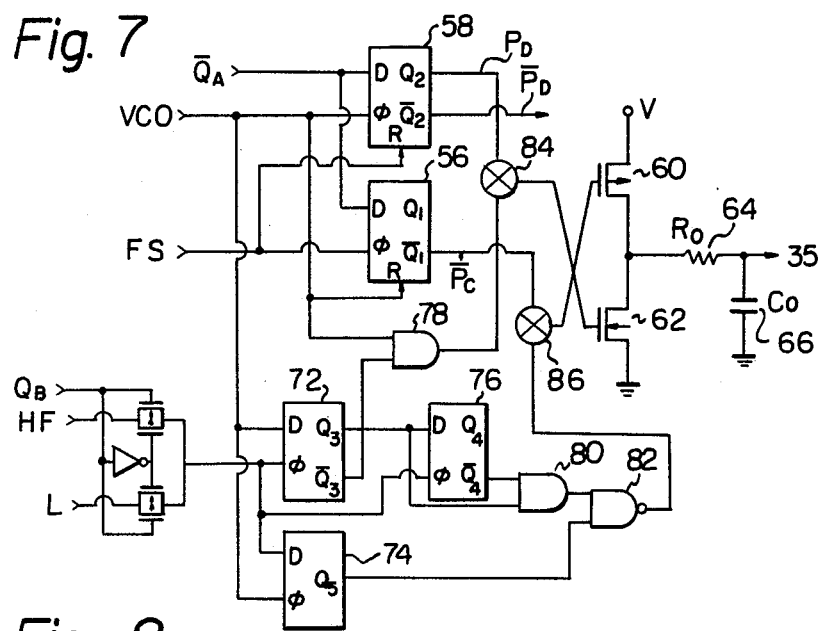
FIG. 7 is a general circuit diagram of a first embodiment of a phase lock loop circuit in accordance with the present invention.

Referring now to FIG. 7, an embodiment of a phase comparator 12, charge pump 14 and of circuit elements performing the function of electronic switch 36, shown in FIG. 2, are shown. The phase comparator portion of the circuit in FIG. 7 is identical to frequency comparator circuit 12 shown in FIG. 5 above, however in order to deactivate FF 58 and FF 56 during PL operation, the data terminals of these flip-flops are connected to the $\overline{Qa}$ output of FF 28 shown in FIG. 4, which goes to the L level during PL operation. The charge pump circuit, comprising FET 60 and FET 62, resistor 64 and capacitor 66, is also identical to the charge pump circuit shown in FIG. 5. However electronic switches 84 and 86 are coupled between FF 56 and the gate of FET 60, and between the gate of FET 62 and FF 58 respectively.

In the PS mode of operation, signals FS and VCO are compared, and output pulses Pd and Pc are generated by FF 58 and FF 56 in accordance with the degree of phase difference between these signals, as described previously with respect to FIG. 5 and FIG. 6. The operation of the circuit in the PL mode, after signals FS and VCO have been brought into phase coincidence, will now be described. In the PL mode of operation, the phase of signal VCO is compared with that of the high frequency signal HF. As shown in the waveform diagram of FIG. 4, signal Qb is at the H level during PL operation. As shown in FIG. 7, signal Qb is applied to control terminals of an electronic switch 70, to which signal HF is applied as an input. When signal Qb is at the L level, the output from switch 70 is also at the L level. When signal Qb is at the H level, then signal HF is applied through electronic switch 70 to the clock terminals of data type flip-flops 72 and 76, and to the data terminal of a data type FF 74. Signal VCO is applied to the data terminal of FF 72, and to the clock terminal of FF 74. Output Q3 of FF 72 is applied to the data terminal of FF 76 and to an input of an AND gate 80. Output $\overline{Q4}$ of FF 76 is applied to the other input of AND gate 80, the output of which is applied to an input of a NAND gate 82. The output Q5 of FF 74 is applied to the other input of NAND gate 82.

During PL operation, the output of NAND gate 82 is applied to the gate terminal of FET 60 by electronic switch 86. Signal VCO and output $\overline{Q3}$ of FF 72 are applied to inputs of an AND gate 78, the output of which is applied to the gate terminal of FET 62 during PL operation, by electronic switch 84. Thus, if the output of NAND gate 82 goes to the L level during PL operation, charging of capacitor 66 through resistor 64 occurs, while if the output of AND gate 78 goes to the H level during PL operation, discharge of capacitor through resistor 64 and FET 62 occurs.

The purpose of performing phase comparison between signals VCO and HF during PL operation is as follows. During PS operation, signals FS and VCO are brought into exact phase and frequency coincidence. Thereafter, when signal FS is inactivated, and PL operation begins, the phase of signal VCO will probably begin to drift with respect to signal HF, which is an integral multiple of signal FS and is of course in phase with signal FS. This drift is due to discharge of capacitor 66 due to leakage current, the effects of temperature variations upon capacitor 66 and other components, etc. So long as the resultant change in phase of signal VCO does not exceed $\pm \pi$ radians with respect to signal HF, then signal VCO can be regarded as an integral submultiple of signal HF, so that the timekeeping accuracy of the timepiece will not be affected.

Figure 8:
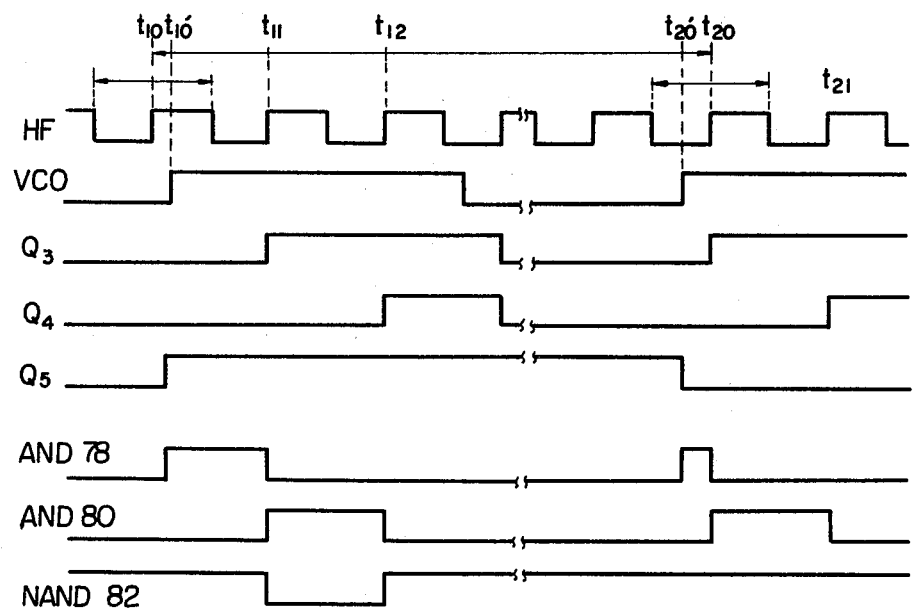
FIG. 8 is a waveform diagram illustrating the operation of the circuit of FIG. 7.

Referring now to FIG. 7 and the waveform diagram of FIG. 8, signal VCO is shown as initially lagging in phase with respect to signal HF at time $t_{10}'$ by an amount equal to $(t_{10}' - t_{10})$. In order to decrease this phase lag of signal VCO, it is necessary to increase the level of charge in capacitor 66. This is accomplished by discharging capacitor 66 for a certain period of time, and then charging capacitor 66 for a slightly longer period of time, with the difference between the charge and discharge periods being equal to $(t_{10}' - t_{10})$. This is done as follows. Output Q3 of FF 72 goes to the H level at time $t_{11}$, as a result of the HF signal applied to its clock terminal and signal VCO applied to its data terminal. Output Q4 of FF 76 goes high at time $t_{12}$. The output of FF 74 has already gone high at time $t_{10}'$. As a result, the output of AND gate 78 goes to the H level from time $t_{10}'$ to $t_{11}$. AND gate 80 provides the logical product of signals Q3 and $\overline{Q4}$, so that its output goes to the H level from time $t_{11}$ to $t_{12}$. NAND gate 82 provides the logical product of signal Q5 and the output from AND gate 80, so that its output goes to the L level from time $t_{11}$ to time $t_{12}$. This is an output pulse which is the inverse of the output pulse from AND gate 80 over the same time interval. The output from NAND gate 82 causes charging of capacitor 66 through resistor 64 and FET 60 to occur from $t_{11}$ to $t_{12}$. While the output from AND gate 78 causes discharge of capacitor 66 through resistor 64 and FET 62 from time $t_{10}'$ to $t_{11}$. Thus, in effect, charging of capacitor 66 for a time duration of ($t_{10}' - t_{10}$) occurs. In this way, charging of capacitor 66 to provide an increase in the frequency of signal VCO is performed, in order to compensate for a phase lag of signal VCO relative to signal HF. Subsequently, at time $t_{20}'$, signal VCO is leading signal HF in phase, by an amount ($t_{20} - t_{20}'$). In this case, output Q3 of FF 72 goes to the H level at time $t_{20}$. The output of AND gate 78 therefore goes to the H level from time $t_{20}'$ to time $t_{20}$. Discharge of capacitor 66 through resistor 64 and FET 62 therefore occurs from time $t_{20}'$ to time $t_{20}$. At time $t_{20}'$, the output Q5 of FF 74 goes to the L level, thereby inhibiting NAND gate 82. Thus, even when the output of AND gate 80 goes to the H level at time $t_{20}$, no output is produced from NAND gate 82 to cause charging of capacitor 66. In this way, discharge of capacitor 66, in order to cause an increase of the period of signal VCO, is produced to compensate for signal VCO leading signal HF in phase.

It is also possible to apply phase control of the VCO signal during PL operation. This can be done by using the inverse of the signal produced by AND gate 78 in the same manner as the signal $\overline{Pd}$ is used during PS operation. Otherwise, the gate of the phase control element of the variable frequency oscillator circuit (e.g. FET 50 in FIG. 5) can be held at the H level during PL operation.

Figure 9A:
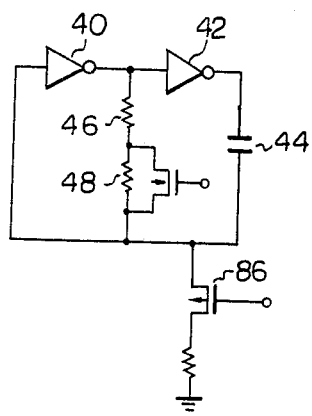
FIG. 9A to FIG. 9E show various modifications of a part of a voltage controlled oscillator of FIG. 7.
Figure 9B:
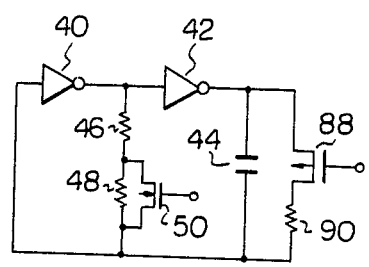
Figure 9C:
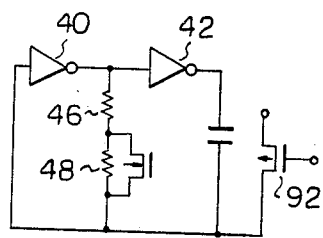
Figure 9D:
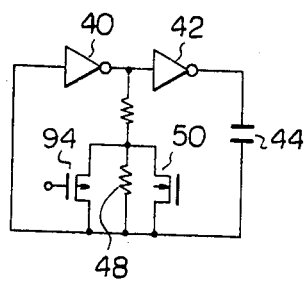
Figure 9E:
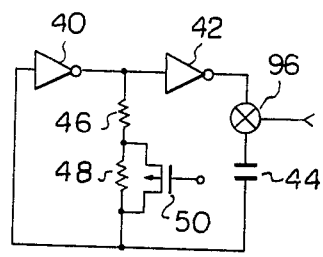

Referring now to FIGS. 9A to 9E, various modifications are shown therein of a voltage controlled oscillator circuit for phase lock loop in accordance with the present invention, such as that shown in FIG. 5. In the example of FIG. 9A, a P-channel FET 86 is utilized as a phase control element, which causes capacitor 44 to be discharged to its gate terminal. In the example of FIG. 9B, a control signal applied to the gate of FET 88 causes capacitor 44 to be discharged through resistor 90. In the example of FIG. 9C, application of a control voltage to FET 92 causes a fixed voltage to be applied to the junction of capacitor 44 and resistor 48. In the example of FIG. 9D, application of a control voltage to the gate of FET 94 causes resistor 48 to be short-circuited. In the example of FIG. 9E, application of a control signal to electronic switch 96 causes the path for charging capacitor 44 to be interrupted, so that a delay in the phase of signal VCO can be produced, if the phase comparator circuit detects that the phase of signal VCO is leading that of signal FS.

Figure 10:
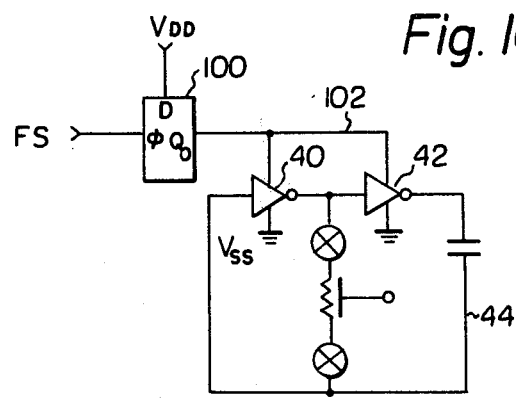
FIG. 10 is a diagram illustrating a method of reducing the time taken to achieve phase lock, with a phase lock loop in accordance with the present invention.

Referring now to FIG. 10, a circuit arrangement is shown therein, in generalized form, of a method whereby the time taken to establish phase and frequency coincidence between signal FS and signal VCO can be reduced at the time of applying power to the timepiece circuitry. Numerals 40 and 42 indicate the inverters of the variable frequency oscillator circuit, which can be of the form shown as 8 in FIG. 5 or one of the modified circuits shown in FIGS. 9A to 9D. When power is applied (i.e. the timepiece battery is inserted), voltage $V_{dd}$ goes to the H level, but output Qc remains at the L level. When signal FS then goes from the L level to the H level, the output Qc of FF 100 goes to the H level, thereby supplying a voltage to power the inverters 40 and 42 of the variable frequency oscillator. The first cycle of signal VCO is therefore initiated a short time after an L level to H level transition of signal FS. Signals VCO and FS can therefore be subsequently brought into exact phase synchronism by the action of the phase lock loop within a short period of time.

Figure 11:
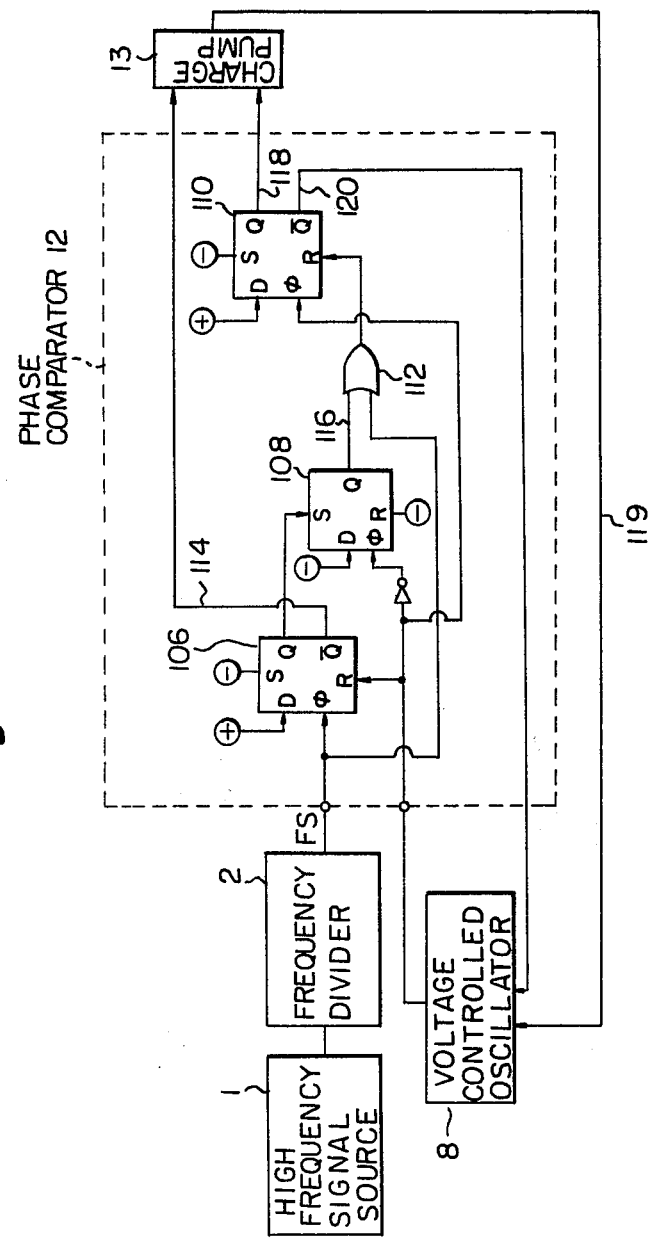
FIG. 11 is an embodiment of a phase comparator for a frequency division system in accordance with the present invention.

FIG. 11 shows a second embodiment of the phase comparator circuit 12 indicated in the block diagram of FIG. 2. This embodiment is designed to make the phase comparison process substantially independant of the duty cycle of the VCO and FS signals. Numeral 1 indicates a standard frequency signal source, while numeral 2 denotes a frequency divider which may or may not incorporate a gate circuit such as gate 10 in FIG. 3, to provide an output signal FS of relatively low frequency when the timepiece is in the PS mode of operation. Signal FS is applied to the clock terminal of a data type flip-flop 106 in phase comparator circuit 12, and to an input of an OR gate 112. The signal VCO from voltage controlled oscillator 8 is applied to the reset terminal of FF 106, and to the clock terminal of a data type FF 110. Signal VCO is also inverted and applied to the clock terminal of a data type FF 108, the data terminal of which is connected to the L level potential. The Q output of FF 106 is applied to the set terminal of FF 108, while the $\overline{Q}$ output of FF 106 is applied to an input of charge pump circuit 13. The Q output of FF 108 is applied to an input of OR gate 112, the output of which is coupled to the reset terminal of FF 110. The Q output of FF 110, denoted as 118, is applied to an input of charge pump circuit 13. The $\overline{Q}$ output of FF 110 is applied to voltage controlled oscillator circuit 8, to perform direct control of the phase of signal VCO. The data terminals of FF 106 and 110 are connected to the H level potential.

Figure 12:
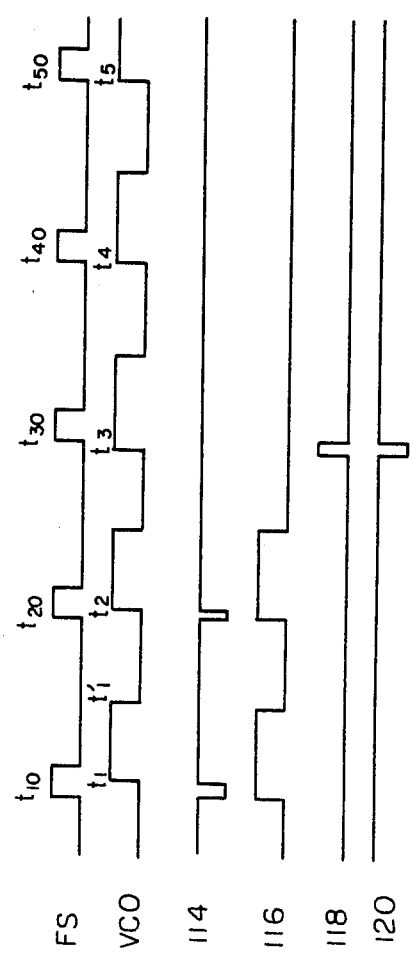
FIG. 12 is a waveform diagram illustrating the operation of the circuit of FIG. 11.

The operation of this circuit will now be described, with reference also to the waveform diagram of FIG. 12. At time $t_{10}$, signal FS goes to the H level, causing output Q of FF 106 to go to the H level, thereby setting FF 108. At the same time, the Q output of FF 106, denoted by numeral 114, goes to the L level. Since the output of FF 108, denoted by numeral 116, is now at the H level, the H level output of OR gate 112 causes FF 110 to be reset, thereby holding the $\overline{Q}$ output of FF 110 (denoted by numeral 120) at the H level.

Signal VCO is lagging signal FS in phase, and does not go to the H level until time $t_1$. This causes FF 106 to be reset, so that output 114 returns to the H level. Subsequently, at time $t_1'$, the trailing edge of signal VCO, inverted and applied to the clock terminal of FF 108, causes output 116 to return to the L level.

At time $t_{20}$, signal VCO is still lagging with respect to signal FS, so that the process described above is repeated, and output 114 again goes to the L level for a short period of time. Output 114, applied to charge pump 13, causes charge pump 13 to change the control voltage applied to variable frequency oscillator 8, denoted by numeral 8, in such a way as to decrease the period of signal VCO. It will be noted that each time that signal FS goes from the L level to the H level while signal VCO is at the L level, an H level pulse is applied as output 116 through OR gate 112, which holds FF 110 in the reset state and prevents FF 110 from responding to the subsequent L level to H level transition of signal VCO.

At time $t_3$, signal VCO is leading signal FS in phase. When signal VCO goes to the H level at the clock terminal of FF 110, output 118 of FF 110 goes to the H level, while the inverse of this output, 120, goes from the H level to the L level. Signal VCO also holds FF 106 in the reset state. At time $t_{30}$. Signal FS goes to the H level, so that an output is produced from OR gate 112 which resets FF 110, causing signal 118 to return to the L level and signal 120 to return to the H level. Pulse 118, applied to charge pump 13, causes the period of signal VCO to be increased, by changing the level of control signal 119. Pulse 120, applied to voltage controlled oscillator 8, causes signal VCO to be delayed in phase.

From the above description, it will be apparent that the operation of this circuit is such that phase comparison is performed based only on the timings of the leading edges of signals FS and VCO. Signal FS can therefore have a low duty cycle, without the phase comparison operation being adversely affected.

Figure 13A:
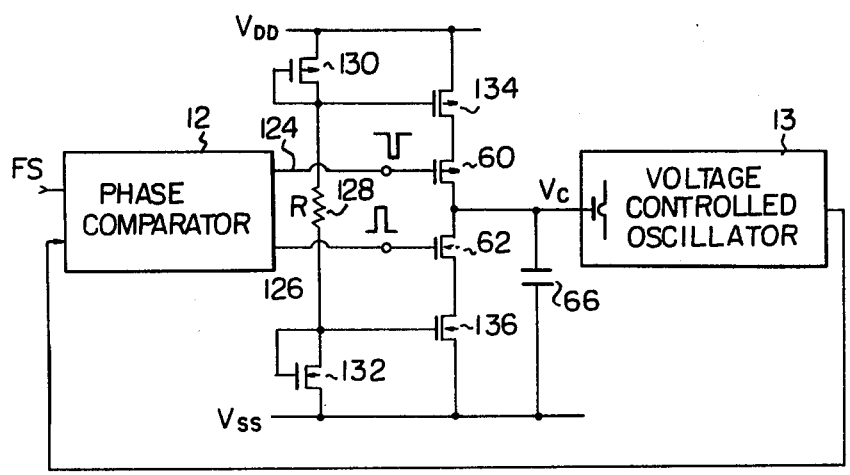
FIG. 13A shows a first embodiment of a constant current charge pump circuit.

Referring now to FIG. 13A, a first embodiment of a constant current charge pump circuit is shown therein. In the case of a charge pump having the configuration shown in FIG. 5 above (denoted by numeral 13), the amount of change in the voltage across capacitor 66 in response to a control pulse causing charging (i.e. signal Pc) or discharging (i.e. signal Pd) depends upon the voltage level across the capacitor 66 when the control pulse is applied. For example, if the voltage across capacitor 66 is at a high level, close to that of voltage $V_{dd}$ i.e. close to voltage $V_{ss}$, then application of a control pulse which makes FET 60 conductive will only result in a relatively small charging current flowing into capacitor 66. If the voltage across capacitor 66 is at a low level, then the same duration of control pulse will cause a relatively high charging current to flow into capacitor 66, so that a relatively large increase in the voltage across capacitor 66 results. With the circuit shown in FIG. 13A, however, the charging and discharging currents are made virtually independent of the voltage across capacitor 66, within a range which is only slightly less than $(V_{dd}-V_{ss})$.

The operation of this circuit is as follows. FETs 130 and 132 serve as variable resistance elements. The voltage developed across each of FETs 130 and 132 can be adjusted by variation of resistor 128, thereby varying the gate voltages of FETs 130 and 132, and so varying the current which flows through them. The voltage across FET 130 is applied between the gate and source of an FET 134, and that developed across FET 132 is applied between gate and source of FET 136. When a negative-going pulse is applied to the gate of FET 60, indicating that signal VCO is lagging and that therefore a charging current is to be applied to capacitor 66, a current flows into capacitor 66 from FET 134 through FET 60, the value of which is determined by the gate-to-source voltage of FET 134, i.e. by the voltage across FET 130. This charging current is virtually independent of the voltage across capacitor 66, so long as that voltage is slightly lower than $V_{dd}$. Similarly, if a positive-going pulse is applied to the gate terminal of transistor 62, indicating that the phase of signal VCO is leading that of signal FS and that a discharging current is to flow out of capacitor 66, then a current flows from capacitor 66 through FET 62 and FET 136. The value of this discharge current is determined by the gate-to-source voltage of FET 136, which is the voltage across FET 132. This current is essentially independent of the voltage across capacitor 66, so long as that voltage is slightly greater than $V_{ss}$.

Thus, the circuit embodiment of FIG. 13A provides constant current charging and discharging of capacitor 66 to be performed.

It is possible to instal an electronic switch in series with FETs 130 and 132 and resistor 128, so that the current flow through this path can be cut off when no control pulses are being provided by phase cmparator 12, such as when the timepiece is operating in the PL mode.

Figure 13B:
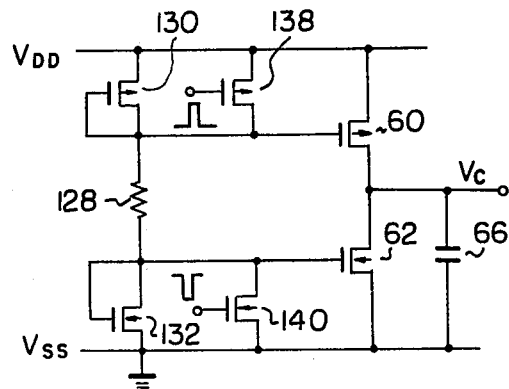
FIG. 13B shows a second embodiment of a constant current charge pump circuit.

FIG. 13B shows another embodiment of a constant current charge pump circuit. FET 138 is connected across the drain and source of transistor 130, while FET 140 is connected across the drain and source terminals of FET 128. If the VCO signal is in phase with the FS signal, then the signal applied to the gate of FET 138 remains at the L level, so that FET 138 presents a low resistance, and no voltage appears between the gate and source terminals of FET 60. Similarly, the signal applied to the gate of FET 140 remains at the H level, so that FET 140 presents a low resistance between its drain and source terminals, so that no voltage appears across the gate and source terminals of FET 62. If signal VCO is detected to be lagging in phase with respect to signal FS, then a positivegoing pulse is applied to the gate terminal of FET 138, causing the resistance between source and drain of FET 138 to become extremely high. At this time, a current flows through FET 130, causing a voltage to be developed across FET 130 drain and source terminals, and therefore between the gate and source terminas of FET 60. The value of this current is determined by the value of resistor 128, and can be adjusted by varying this resistor. A current therefore flows from FET 60 into capacitor 66, to charge capacitor 66. The value of this charging current is determined by the value of the voltage appearing across the source and drain of FET 130, and is essentially independent of the value of voltage appearing across capacitor 66. This charging current flows for the duration of the positive-going pulse applied to the gate of FET 138.

If the phase of signal VCO is detected to be leading with respect to signal FS by the phase comparator circuit, then a negative-going pulse appears at the gate of FET 140, causing the resistance between drain and source of FET 140 to become extremely high. As a result, a voltage is developed across the gate and source terminals of FET 62, the value of which is determined by the current which passes through resistor 128 and FET 132. A discharge current therefore flows from capacitor 66 through FET 62 to ground. The value of this discharge current is essentially independent of the value of voltage across capacitor 66, if this voltage is slightly higher than voltage $V_{ss}$.

Thus, the circuit of FIG. 13B also enables constant current charing and discharging of capacitor 66 to be performed, at a rate which is independent of the voltage appearing across capacitor 66.

Figure 14:
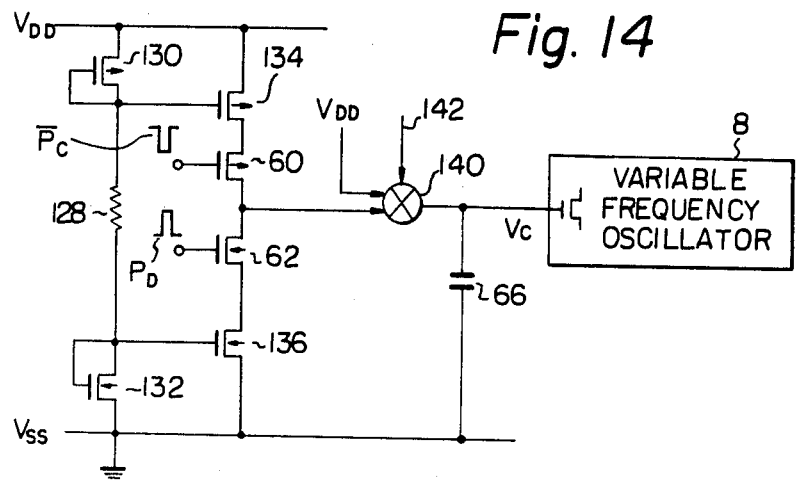
FIG. 14 shows a modification of the circuit of FIG. 13A, for achieving phase lock in a shorter time after power is applied.
Figure 15A:
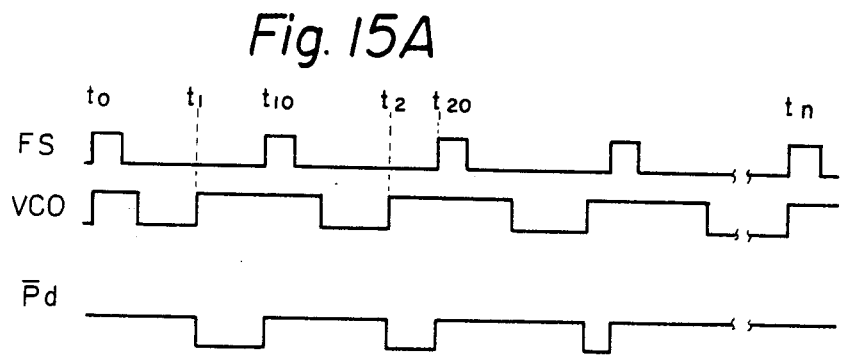
FIG. 15A is a waveform diagram illustrating the operation of the circuit of FIG. 14.
Figure 15B:
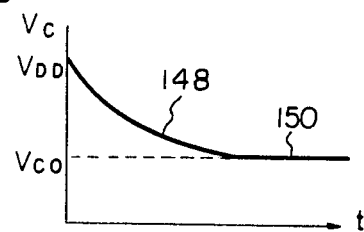
FIG. 15B is graph illustrating the variation of the output voltage of the circuit of FIG. 14 until phase lock is achieved.

An embodiment of a circuit which ensures that signal VCO is brought into phase coincidence with signal FS in a relatively short time, from an initial condition of phase lead, when power is first applied to the timepiece circuit, is shown in FIG. 14. The circuit of FIG. 14 is basically a constant current charge pump circuit of the type shown in FIG. 13A above, but with the addition of an electronic switch 141. Electronic switch 141 has one input connected to the output of the constant current charge and discharge FETs 60 and 62, and another input connected to receive supply voltage $V_{dd}$ (i.e. the H level potential). Numeral 142 indicates a control signal applied to a control terminal of electronic switch 141. Control signal 142 momentarily causes electronic switch 141 to apply $V_{dd}$ to capacitor 66 at the time of initiation of operation of the timepiece circuit, and thereafter causes electronic switch 141 to connect capacitor 66 to the outputs of constant current charge and discharge FETs 60 and 62, causing the average voltage appearing across capacitor 66 with respect to time to be as shown in FIG. 15B. This will be explained with reference to the timing diagram of FIG. 15A. At the initiation of timepiece circuit operation (or after battery replacement), signal 142 causes the voltage across capacitor 66 to go to the $V_{dd}$ level, i.e. the maximum positive potential. As a result, the period of signal VCO attains a minimum value, so that, after the initiation of operation at time $t_0$, the VCO signal goes to the H level at time $t_1$, while signal FS does not go to the H level until time $t_{10}$. In other words, signal VCO is leading signal FS. Thereafter, since positive-going pulses will be applied to the gate of FET 62 from the phase comparator circuit, will be periodically discharged, along a characteristic with respect to time having the form shown in FIG. 15B, i.e. along an exponential curve towards a steady-state value $V_{cO}$. At voltage $V_{co}$, signal VCO has been brought into phase coincidence with signal FS.

If the method shown in FIG. 14 is not adopted, then it is possible that signal VCO will be lagging in phase with respect to signal FS at the initiation of operation. Since direct phase control is not conducted upon signal VCO until it has come into a phase leading condition with respect to signal FS, a substantially greater amount of time will elapse before phase lock is achieve, as compared with the case in which signal VCO is leading signal FS.

Figure 16:
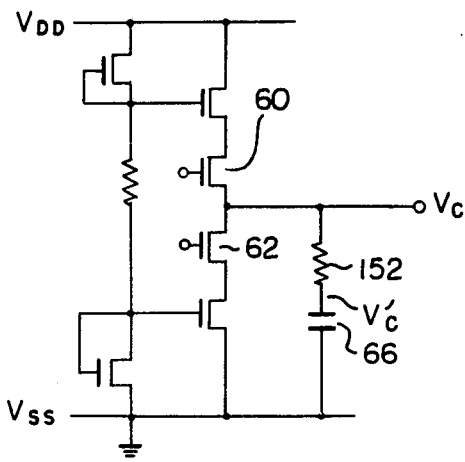
FIG. 16 shows a modification of the constant current charge pump of FIG. 14, for achieving second order damping within the phase lock loop.

Referring now to FIG. 16, a method is shown of achieving second order damping within the phase lock loop circuit. If a capacitor 66 is utilized alone in the charge pump circuit, as in the embodiments of phase lock loop circuits described above, then satisfactory control for large phase and frequency differences can be achieve. However, if the amoung of difference in phase is relatively small, so that very narrow control pulses must be produced by the phase comparator circuit, and applied to the charge pump circuit as well as to the variable frequency oscillator circuit to provide direct phase control, it is possible that unsatisfactory operation will be obtained. It is also possible that continuous slight oscillation of the phase of signal VCO may occur.

To prevent such difficulties, the circuit of FIG. 16 can be used. A resistor 152 is connected in series with capacitor 66, and the control voltage $V_c$ to be applied to the variable frequency oscillator is taken from the junction of the resistor 152 and the outputs of charge and discharge control FETs 60 and 62. Resistor 152 can be considered as an integration element, from the viewpoint of the overall phase lock loop. If it is assumed that the phase of signal VCO is undergoing a minute degree of oscillation, with respect to signal FS, then this would mean that voltage $V_c$ is oscillating slightly. A voltage $V_c'$ therefore appears across capacitor 66, which tends to counteract voltage $V_c$, if a suitable value of resistor is utilized. The minute oscillations of the phase of signal VCO can thus be suppressed, and a reduction of overshoot in the response characteristics of the phase lock loop is also attained. The phase of signal VCO can therefore be locked precisely into coincidence with that of signal FS.

Figure 17:
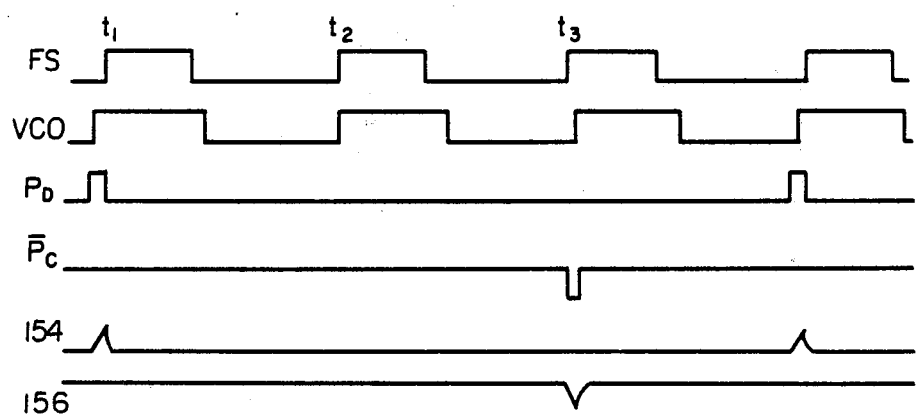
FIG. 17 is a waveform diagram illustrating a method of extending the minimum duration of control pulses applied to a charge pump circuit of a phase lock loop circuit in accordance with the present invention.
Figure 18:
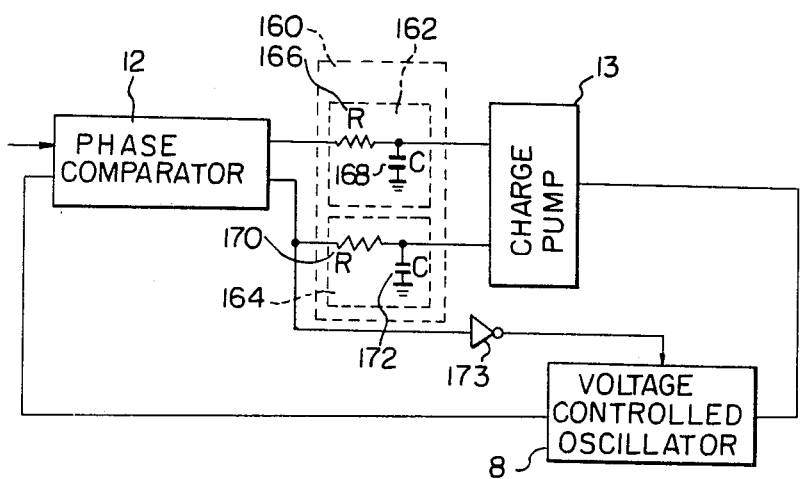
FIG. 18 is a general block diagram illustrating a method of achieving the extension of duration of control pulses as shown in FIG. 17.

The waveform diagram of FIG. 17 and the circuit diagram of FIG. 18 illustrate another method of improving the response of the phase lock loop circuit to very small differences in phase between signals VCO and FS. Integrator circuits 162 and 164 are connected to receive the control pulses $P_c$ and $P_d$ produced by phase comparator circuit 12. As a result, if pulses $P_d$ are of very short duration, then the action of integrator circuit 164 will cause pulses $P_d$ to be lengthened, to produce the output signal 154 shown in FIG. 17. As a result, since charge pump circuit 13 can respond to the lengthened pulses 154, effective discharging of the control voltage capacitor 66 will occur. In other words, without the inclusion of integrator circuits 164 and 162, the phase lock loop is incapable of compensating for very small differences in phase, due to the inability of charge pump circuit 13 to respond to the very short control pulses which are output by comparator circuit 12. By utilizing integrator circuits 162 and 164, therefore, the degree of precision of phase lock which can be achieved is significantly extended.

Figure 19:
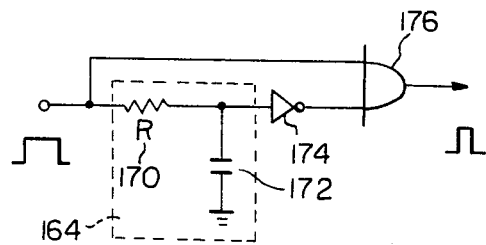
FIG. 19 is a diagram showing a modification of the circuit of FIG. 18 whereby the maximum duration of a control pulse applied to a charge pump is limited.

If it is desired to limit the maximum duration of the conrtrol pulses $P_d$ and $P_c$, then a circuit such as that shown in FIG. 19 can be utilized. Here, an inverter 174 is coupled to receive the output of integrator 164. The output of inverter 174 is applied to one input of an AND gate 176, the other input of which receives signal $P_d$. After signal $P_d$ goes to the H level, since the output of inverter 174 is at the H level, the output of AND gate 176 goes to the H level. Subsequently, when the voltage across capacitor 172 rises to reach the threshold voltage of inverter 174, the output of inverter 174 goes to the L level, and the output of AND gate 176 therefore goes to the L level. A pulse of predetermined duration is therefore obtained from the output of AND gate 176, to be applied as a control pulse to charge pump circuit 13, even if pulse $P_d$ is of excessively long duration.

In an electronic timepiece utilizing a frequency division system in accordance with the present invention, as described above, the phase of the VCO signal is compared with that of the HF signal while the circuit is in the PL mode of operation. So long as only very small variations in the phase of signal VCO occur, then this is satisfactory. However, if a sudden large change in the phase of signal VCO occurs, this cannot be compensated for in the PL mode of operation, and the VCO signal may then become locked in phase with the HF signal once more, but after having changed in phase by an amount equivalent to several periods of the HF signal. If this occurs, then the timekeeping accuracy of the timepiece will be affected, since the frequency of signal VCO is no longer the integral submultiple of the frequency of signal HF determined by the frequency division ratio. Such a sudden large change in the phase of signal VCO can occur when the voltage of the timepiece battery undergoes a sudden change. In the case of a digital display type of timepiece, for example, such a change in battery voltage can occur when an alarm device is actuated to give an audible alarm, or when a dial illumination lamp is actuated. In the case of an analog display type of timepiece having time indicating hands driven by a stepping motor, a large change in battery voltage can occur when a pulse of current is drawn by the motor as the hands are advanced, once per second in general. It is therefore desirable to provide some means for forecasting when such a change in battery voltage will occur, and to ensure that the timepiece is set to operate in the PS mode before such a change occurs, so that immediate compensation for any change in phase of signal VCO can be provided by the phase lock loop.

FIG. 20 illustrates an embodiment of a circuit to achieve the above objective. This circuit is applicable to an analog display type of timepiece having a stepping motor for advancing the timepiece hands. A time unit signal is produced from second stage frequency divider 4 once per second, and is applied to a motor drive circuit (omitted from FIG. 20) to produce a motor drive pulse, which generally has a pulse width of several milliseconds. Battery load prediction circuit 178 is connected to frequency divider 4 in such a way as to generate a PS initiating signal, just prior to a motor drive pulse being generated. This signal is applied to electronic switch 6, so as to change the mode of operation of the timepiece to the PS mode, from the PL mode. When the motor drive pulse has ended, so that the battery has returned to a normal load condition, phase coincidence detection circuit 16 begins operation. Coincidence detection circuit 16 then compares the phase of signal VCO from variable frequency oscillator 8 with that of signal FS from gate 10. If these signals are in phase coincidence, then a signal from phase coincidence detection circuit 16 causes battery load prediction circuit 180 to generate a signal which causes electronic switch 6 to initiate PL operation. This continues until the next motor drive pulse is about to be produced.

It is possible to combine battery load prediction circuit 180 with the motor drive circuit of the timepiece. Also, if the frequency range of variable frequency oscillator circuit 8 is, for example, approximately 32 KHz, then the maximum time that will be required to establish phase lock between signals VCO and FS after the PS mode of operation is entered will be 1 millisecond. In this case, it may not be necessary to utilize a phase coincidence detection circuit. Instead, the frequency division system can be set into the PS operating mode immediately before each motor drive pulse, and restored to the PL operating mode upon the completion of the drive pulse.

Although the circuit example of FIG. 20 has been described with respect to a timepiece having a stepping motor and hands, it is equally possible to provide a battery load prediction circuit which will, for example, cause the frequency division system to be set in the PS mode of operation when the timepiece dial illumination lamp switch is depressed, before power is actually supplied to the lamp.

It is also possible to utilize a timer circuit, as shown in FIG. 2, in conjunction with a battery load prediction circuit such as that of FIG. 20, so that the phase of signal VCO can be compared with that of signal FS within a shorter interval of time than one second, i.e. at times in between moror drive pulses.

Such a battery load prediction circuit can also be used to change over to PS operation just before the alarm device of the timepiece is actuated, in the case of an alarm timepiece.

It is also possible to modify battery load prediction circuit 178 in such a way that the PS operating mode is initiated when the operating temperature goes above or below a certain predetermined level, beyond which the charge on the charge pump capacitor could be expected to change relatively rapidly. It is also possible to arrange that battery load prediction circuit 178 will cause the PS operating mode to be initiated if a high level of mechanical shock is applied to the timepiece, which can result in a momentary variation of battery voltage.

By arranging through methods such as described in the preceding paragraphs, to initiate PS operation of the timepiece when any condition which can cause a relatively large change in the phase of signal VCO is detected, a high degree of reliability can be assured with respect to the accuracy of timekeeping. The advantage of operating frequency divider 2 an in intermittent manner, i.e. a significant reduction of power consumption, can therefore be attained without a deteriration of performance of the timepiece.

It should be noted that, although the above description of the frequency division system of the present invention has been give with respect to application to electronic timepiece, such a system is equally applicable to various other devices for which an extremely low level of power consumption is essential and in which a low frequency signal of high accuracy with respect to frequency must be generated from a high frequency standard signal source.

Thus, although the present invention has been shown and described with respect to particular embodiments, it should be noted that various changes and modifications of these embodiments are possible, which fall within the scope claimed for the present invention.

What is claimed is:

1. A frequency division system for producing a phase locked signal of relatively low frequency which is synchronized in phase with a signal of relatively high frequency and whose frequency is an integral submultiple of said relatively high frequency, comprising:

frequency divider circuit means responsive to said relatively high frequency signal for producing a reference signal of said relatively low frequency;

a voltage controlled oscillator circuit for generating said phase locked signal, comprising a first control element for controlling the frequency of said phase locked signal and a second control element for controlling the phase of said phase locked signal in an instantaneous manner;

a phase comparator circuit for comparing the phase of said phase locked signal and the phase of said reference signal and for producing a first control signal if the phase of said phase locked signal is lagging that of said reference signal and for also producing a second control signal if the phase of said phase locked signal is leading the phase of said reference signal, whereby one of said first and second control signals is applied to said second control element of said voltage controlled oscillator circuit to cause the phase of said phase locked signal to come into coincidence with said reference signal phase; and a charge pump circuit comprising a capacitor, charge control means responsive to said first control signal for increasing the amount of charge in said capacitor and discharge control means responsive to said second control signal for decreasing the amount of charge in said capacitor, the voltage appearing across said capacitor being applied to said first control element of said voltage controlled oscillator circuit so as to cause the frequency and phase of said phase locked signal to come into coincidence with the frequency and phase of said reference signal.

2. A frequency division system according to claim 1, and further comprising means for producing a third control signal for selectively setting said frequency division system in a pre-scaling mode of operation and in a phase locked mode of operation, and furthermore comprising electronic switch means responsive to said third control signal for applying said reference signal to said phase comparator circuit to be compared in phase with said phase locked signal in said pre-scaling mode of operation and for inhibiting operation of said frequency divider circuit means and applying said relatively high frequency signal to said phase comparator circuit to be compared in phase with said phase locked signal in said phase locked mode of operation, whereby said phase locked signal is brought into phase and frequency coincidence with said reference signal during said pre-scaling mode of operation and is held in phase coincidence with said relatively high frequency signal during said phase locked mode of operation.

3. A frequency division system according to claim 2, and further comprising;

timer circuit means for measuring a predetermined duration of said phase locked operating mode and for producing a fourth control signal when said predetermined duration has elapsed;

phase coincidence detection circuit means coupled to receive said phase locked signal and said first and second control signals for detecting a condition of phase and frequency coincidence between said phase locked signal and said reference signal, and for producing a fifth control signal when said condition of phase and frequency coincidence is detected; and control circuit means responsive to said fourth and fifth control signals for producing said third control signal, whereby said pre-scaling mode of operation is entered when said predetermined duration of said phase locked mode of operation has elapsed and whereby said phase locked mode of operation is entered when said condition of phase and frequency coincidence between said phase locked signal and said reference signal is detected during said pre-scaling mode of operation.

4. A frequency division system according to claim 1, wherein said voltage controlled oscillator further comprises a combination of resistive and capacitative elements to determine a time constant which defines the frequency of said phase locked signal, and wherein said first control element is coupled to at least a part of said resistive and capacitative elements to control the value of said time constant and thereby to control the frequency of said phase locked signal.

5. A frequency division system according to claim 4, wherein said second control element is coupled to at least a part of said resistive and capacitative elements for selectively enabling and disenabling charging and discharging of said capacitative elements through said resistive elements, to thereby control the phase of said phase locked signal in response to one of said first and second control signals from said phase comparator circuit.

6. A frequency division system according to claim 4, wherein said second control element is connected across at least a part of said capacitative elements, for selectively establishing an open circuit and a closed circuit condition in response to one of said first and second control signals from said phase comparator.

7. A frequency division system according to claim 4, wherein said second control element is connected between a part of said combination of resistive and capacitative elements and a source of a fixed voltage, for thereby selectively connecting and disconnecting said part of said combination of resistive and capacitative elements to and from said fixed voltage source, in response to one of said first and second control signals from said phase comparator.

8. A frequency division system according to claim 4, wherein said first control element comprises a field effect transistor having source and drain terminals connected across at least a part of said resistive elements of said voltage controlled oscillator, and having a gate terminal coupled to receive said voltage appearing across said capacitor of said charge pump circuit.

9. A frequency division system according to claim 5, wherein said second control element comprises an electronic switch connected in series with a part of said resistive elements and having a control electrode coupled to receive one of said first and second control signals from said phase comparator.

10. A frequency division system according to claim 1, wherein said phase comparator comprises:

a first data-type flip-flop having a data terminal coupled to a high logic level potential, a clock terminal coupled to receive said reference signal, and a reset terminal coupled to receive said phase locked signal from said voltage controlled oscillator circuit; and a second data-type flip-flop having a data terminal coupled to said high logic level potential, a clock terminal coupled to receive said phase locked signal, and reset terminal coupled to receive said reference signal.

11. A frequency division system according to claim 10, wherein said first control signal is produced from the inverting output terminal of said first data type flip-flop and said second control signal is produced from a normal output terminal of said second data type flip-flop.

12. A frequency division system according to claim 10, wherein said phase comparator circuit further comprises:

a third data type flip-flop having a clock terminal coupled to receive said relatively high frequency signal, and a data terminal coupled to receive said phase locked singal;

a fourth data type flip-flops having a clock terminal coupled to receive said phase locked signal and a data terminal coupled to receive said relatively high frequency signal;

a fifth data type flip-flop having a data terminal coupled to a normal output terminal of said third data type flip-flop and a clock terminal coupled to receive said relatively high frequency signal;

first AND gate means having an input terminal coupled to an inverting output terminal of said third data type flip-flop and another input terminal coupled to receive said phase locked signal;

second AND gate means having an input terminal coupled to an inverting output terminal of said fourth data type flip-flop and another input terminal coupled to said normal output of said third data type flip-flop;

NAND gate circuit means having an input terminal coupled to a normal output terminal of said fifth data type flip-flop and another input terminal coupled to an output of said second AND gate means;

first electronic switch means coupled to said normal output terminal of said second data type flip-flop and to an output of said first AND gate means, for producing a signal indicating that the phase of the phase locked signal is leading that of said reference signal during the pre-scaling operation mode, and for producing a signal indicating that the phase of the phase locked signal is leading that of said relatively high frequency signal during tha phase locked operation mode; and second electronic swtich means coupled to said inverting output terminal of said first data type flip-flop and to an output terminal of said NAND gate means, for producing a signal indicating that the phase of said phase locked signal is legging that of said reference signal during said pre-scaling operation mode, and for producing a signal indicating that the phase of said phase locked signal is lagging that of said relatively high frequency signal during said phase locked operation mode.

13. A frequency division system according to claim 1, wherein said phase comparator circuit comprises:
 a first data type flip-flop having a data terminal connected to a high logic level potential, a clock terminal coupled to receive said reference signal, and a reset terminal coupled to receive said phase locked signal;
 a second data type flip-flop having a data terminal connected to a low logic level potential, a clock terminal coupled to receive the inverse of said phase locked signal, and a set terminal coupled to a normal output terminal of said first data type flip-flop;
 an OR gate having an input terminal coupled to a normal output terminal of said second data type flip-flop and another input terminal coupled to receive said reference signal;
 a third data type flip-flop having a data terminal connected to a high logic level potential, a reset terminal coupled to an output of said OR gate, whereby an output signal is produced from an output terminal of said first data type flip-flop indicating that said phase locked signal is logging in phase with respect to said reference signal, and an output signal is produced from an output terminal of said third data type flip-flop indicating that said phase locked signal is leading in phase with respect to said reference signal, and furthermore whereby phase comparison between said phase locked signal and said reference signal is significantly independent of the duty cycle of said reference signal.

14. A frequency division system according to claim 1, wherein said charge control means of said charge pump circuit comprises a P-channel field effect transistor and a resistor, with the source terminal of said P-channel field effect transistor being connected to a high potential, a drain terminal thereof connected to one end of said resistor, and a gate terminal thereof connected to receive said first control signal, and wherein said discharge control means comprises an N-channel field effect transistor having a source terminal connected to a low potential, a gate terminal thereof connected to receive said second control signal, and a drain terminal thereof connected to the junction of said resistor and said drain terminal of said P-channel field effect transistor, and wherein the other end of said resistor is connected to one terminal of said capacitor.

15. A frequency division system according to claim 1, wherein said charge pump circuit comprises:
 a first P-channel field effect transistor with the gate and drain terminals thereof connected together and the source terminal connected to a high logic level potential;
 a resistor with one end connected to said drain terminal of said first field effect transistor
 a first N-channel field effect transistor having the gate and drain terminals thereof connected together and to the other end of said resistor and having the source terminal thereof connected to a low logic level potential;
 a second P-channel field effect transistor having a source terminal connected to said high logic level potential and a gate terminal connected to the drain terminal of said first P-channel field effect transistor;
 a third P-channel field effect transistor having a source terminal connected to the drain terminal of said second P-channel transistor and a gate terminal connected to receive said first control signal from said phase comparator circuit;
 a second N-channel field effect transistor having a source terminal connected to said low logic level potential and a gate terminal connected to said drain terminal of said first N-channel field effect transistor;
 a third N-channel field effect transistor having a source terminal connected to a drain terminal of said second N-channel field effect transistor, drain terminal connected to the drain terminal of said third P-channel field effect transistor, and a gate terminal coupled to receive said second control signal from said phase comparator circuit; and
 a capacitor having one terminal connected to the drain terminals of said third P-channel field effect transistor and said third N-channel field effect transistor and having another terminal connected to said low logic level potential.

16. A frequency division system according to claim 1, wherein said charge pump circuit comprises;
 a first P-channel field effect transistor with gate and drain terminals thereof connected together and with the source terminal thereof connected to a high logic level potential;
 a resistor with one end connected to said drain terminal of said first P-channel field effect transistor;
 a first N-channel field effect transistor having the gate and drain terminals thereof connected together and to the other end of said resistor, and having a source terminal thereof connected to a low logic level potential;
 a second P-channel field effect transistor having a source terminal thereof connected to said high logic level potential, a drain terminal connected to the drain terminal of said first P-channel field effect transistor, and a gate terminal coupled to receive said first control signal from said phase comparator circuit;
 a third P-channel field effect transistor having a source terminal thereof connected to said high logic level potential and a gate terminal connected to the drain terminal of said second P-channel field effect transistor;
 a second N-channel field effect transistor having source and drain terminals thereof connected to the source and drain terminals respectively of said first N-channel field effect transistor, and having a gate terminal coupled to receive said second control signal from said phase comparator circuit;

a third N-channel field effect transistor having a source terminal connected to said low logic level potential, a gate terminal connected to the drain terminal of said second N-channel field effect transistor and a drain terminal connected to the drain terminal of said third P-channel field effect transistor; and a capacitor having one terminal connected to said drain terminals of said third N-channel and P-channel transistors and having another terminal connected to said low logic level potential.

17. A frequency division system according to claim 1, wherein said charge pump circuit further comprises a source of an operation initiation control signal which is produced when operation of said frequency division system is initiated, and moreover comprises electronic switch means coupled between said capacitor and said charge and dishcarge control means, responsive to said operation initiation control means, responsive to said operation initiation control signal for connecting said capacitor to a high logic level potential for a predetermined period of time when operation of said frequency division system is initiated, to charge said capacitor to said high logic level potential, and for thereafter connecting said capacitor to said charge and discharge control means.

18. An electronic timepiece powered by a battery, comprising:

a source of a standard signal of relatively high frequency;

first frequency divider circuit means responsive to said relatively high frequency signal for producing a signal of relatively low frequency which is an integral submultiple of said relatively high frequency;

a voltage controlled oscillator circuit for generating a phase locked signal which is in phase and frequency coincidence with said relatively low frequency signal, comprising a first control element for controlling the frequency of said phase locked signal and a second control element for controlling the phase of said phase locked signal in an instantaneous manner;

electronic switch means coupled to receive said relatively high frequency signal;

phase comparator circuit menas for comparing the phase of said phase locked signal with that of said relatively low frequency signal when said first frequency divider circuit is enabled by said electronic switch means in a first operation mode and for comparing the phase of said relatively high frequency signal with that of said phase locked signal when said relatively high frequency signal is applied to said phase comparator circuit by said electronic switch means in a second operation mode of said timepiece, and for producing a first control signal indicating that the phase of said phase locked signal is lagging that of said relatively low frequency signal when said timepiece is in said first operation mode and for indicating that the phase of said phase locked signal is lagging that of said relatively high frequency signal when said timepiece is in said second operation mode, and further for producing a second control signal indicating that the phase of said phase locked signal is leading that of said relatively low frequency signal when said timepiece is in said first operation mode and for indicating that the phase of said phase locked signal is leading that of said high frequency signal when said timepiece is in said second operation mode, whereby said second control signal is applied to said second control element of said voltage controlled oscillator circuit for controlling the phase of said phase locked signal;

charge pump circuit means comprising a capacitor, charge control means responsive to said first control signal from said phase comparator circuit for increasing the amount of charge in said capacitor, and discharge control means responsive to said second control signal for reducing the amount of charge in said capacitor, the voltage across said capacitor being applied to said first control element of said voltage controlled oscillator circuit;

second frequency divider circuit means responsive to said phase locked signal for producing a standard time signal; and time display means responsive to said standard time signal for providing a display of time.

19. An electronic timepiece according to claim 18, and further comprising:

timer circuit means for measuring a predetermined duration of said second operation mode and for producing a first mode control signal when said time duration has elapsed;

phase coincidence detection circuit means coupled to receive said phase locked signal and said relatively low frequency signal for detecting a condition of phase and frequency coincidence between them in said first operation mode and for producing a second mode control signal when said condition of phase and frequency coincidence is detected; and control circuit means coupled to said electronic switch means and responsive to said first mode control signal for setting said timepiece in said first operation mode and further responsive to said second mode control signal for setting said timepiece in said second operation mode.

20. An electronic timepiece according to claim 18, and further comprising:

a battery load prediction circuit for detecting a condition of said timepiece in which a significant change in the voltage of said battery is about to occur and for producing a first mode control signal when such a condition is detected;

phase coincidence detection circuit means coupled to receive said phase locked signal and said relatively low frequency signal for detecting a condition of phase and frequency coincidence between them in said first operation mode, and for producing a second mode control signal when said condition of phase and frequency coincidence is detected; and control circuit means responsive to said first mode control signal for setting said timepiece in said first operation mode, and responsive to said second mode control signal for setting said timepiece in said second operation mode if said first mode control signal is not being produced.

* * * * *

UNITED STATES PATENT AND TRADEMARK OFFICE
CERTIFICATE OF CORRECTION

PATENT NO. : 4,244,043
DATED : January 6, 1981
INVENTOR(S) : HIRO FUJITA, ET AL

It is certified that error appears in the above-identified patent and that said Letters Patent are hereby corrected as shown below:

[75] Error --Heihachiro Ebiha--;
Correction requested to "Heihachiro Ebihara".

Signed and Sealed this

Twenty-eighth Day of April 1981

[SEAL]

Attest:

RENE D. TEGTMEYER

Attesting Officer   Acting Commissioner of Patents and Trademarks